US008544167B2

(12) United States Patent
Morita

(10) Patent No.: US 8,544,167 B2
(45) Date of Patent: Oct. 1, 2013

(54) COLLECTIVE MOUNTING METHOD OF ELECTRONIC COMPONENTS AND MANUFACTURING METHOD OF ELECTRONIC COMPONENT-EMBEDDED SUBSTRATE

(75) Inventor: Takaaki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 496 days.

(21) Appl. No.: 11/987,260

(22) Filed: Nov. 28, 2007

(65) Prior Publication Data

US 2008/0211143 A1    Sep. 4, 2008

(30) Foreign Application Priority Data

Dec. 22, 2006   (JP) .................................. 2006-346822

(51) Int. Cl.
*H05K 3/30* (2006.01)
*H05K 3/20* (2006.01)

(52) U.S. Cl.
USPC .................... 29/832; 29/831; 29/834; 29/841

(58) Field of Classification Search
USPC ................................... 29/832, 831, 834, 841
See application file for complete search history.

(56) References Cited

U.S. PATENT DOCUMENTS

| | | | | | |
|---|---|---|---|---|---|
| 3,932,932 | A | * | 1/1976 | Goodman | 29/852 |
| 4,180,608 | A | * | 12/1979 | Del | 428/196 |
| 4,557,792 | A | * | 12/1985 | Yamada et al. | 156/583.1 |
| 4,658,332 | A | * | 4/1987 | Baker et al. | 361/751 |
| 5,111,278 | A | * | 5/1992 | Eichelberger | 257/698 |
| 5,578,159 | A | * | 11/1996 | Miyashita et al. | 156/358 |
| 5,841,193 | A | * | 11/1998 | Eichelberger | 257/723 |
| 6,140,155 | A | * | 10/2000 | Mihara et al. | 438/124 |
| 6,154,366 | A | * | 11/2000 | Ma et al. | 361/704 |
| 6,271,469 | B1 | * | 8/2001 | Ma et al. | 174/521 |
| 6,391,460 | B1 | * | 5/2002 | Tanaka et al. | 428/421 |
| 6,545,354 | B1 | * | 4/2003 | Aoki et al. | 257/734 |

(Continued)

FOREIGN PATENT DOCUMENTS

| | | |
|---|---|---|
| JP | A-3-169029 | 7/1991 |
| JP | A-05-191046 | 7/1993 |

(Continued)

OTHER PUBLICATIONS

European Search Report for European Application No. 07024850.5 dated Mar. 26, 2010.

*Primary Examiner* — David Angwin
(74) *Attorney, Agent, or Firm* — Oliff & Berridge, PLC

(57) ABSTRACT

There is disclosed a collective mounting method of electronic components in which a plurality of electronic components can uniformly be pressed to an insulating layer in a short time in a case where the electronic components and a resin layer are fixed. To manufacture a semiconductor-embedded substrate 200 in which a plurality of semiconductor devices 220 are embedded, after disposing the plurality of semiconductor devices 220 on an unhardened resin layer 212, this is stored in a container 31 of a pressurizing and heating unit 3, the plurality of semiconductor devices 220 are simultaneously, collectively and isotropically pressurized by use of an internal gas in the container 31 as a pressure medium to simultaneously press the plurality of semiconductor devices 220 to the unhardened resin layer 212, and the resin layer 212 is heated and hardened. In consequence, the plurality of semiconductor devices 220 are collectively and uniformly fixed and mounted onto the resin layer 212 without being influenced by a state change of the resin layer 212.

10 Claims, 35 Drawing Sheets

(56) References Cited

U.S. PATENT DOCUMENTS

| | | | |
|---|---|---|---|
| 6,590,291 B2* | 7/2003 | Akagawa | 257/774 |
| 6,658,375 B1* | 12/2003 | McQuarrie et al. | 703/2 |
| 6,674,162 B2* | 1/2004 | Takao | 257/700 |
| 6,720,644 B2* | 4/2004 | Yoshizawa et al. | 257/692 |
| 6,765,299 B2* | 7/2004 | Takahashi et al. | 257/777 |
| 6,870,256 B2* | 3/2005 | Aoki et al. | 257/700 |
| 7,190,064 B2* | 3/2007 | Wakabayashi et al. | 257/691 |
| 7,550,320 B2* | 6/2009 | Wang | 438/125 |
| 7,723,838 B2* | 5/2010 | Takeuchi et al. | 257/700 |
| 7,816,177 B2* | 10/2010 | Takeuchi et al. | 438/106 |
| 7,906,370 B2* | 3/2011 | Morita | 438/106 |
| 2002/0017730 A1* | 2/2002 | Tahara et al. | 257/786 |
| 2002/0084522 A1* | 7/2002 | Yoshizawa et al. | 257/692 |
| 2003/0016510 A1* | 1/2003 | Knapp | 361/761 |
| 2003/0122244 A1* | 7/2003 | Lin et al. | 257/700 |
| 2003/0150101 A1* | 8/2003 | Park et al. | 29/621 |
| 2003/0197285 A1* | 10/2003 | Strandberg et al. | 257/778 |
| 2003/0230804 A1* | 12/2003 | Kouno et al. | 257/734 |
| 2004/0046254 A1* | 3/2004 | Lin et al. | 257/734 |
| 2004/0195686 A1* | 10/2004 | Jobetto et al. | 257/734 |
| 2005/0098891 A1* | 5/2005 | Wakabayashi et al. | 257/758 |

FOREIGN PATENT DOCUMENTS

| | | |
|---|---|---|
| JP | A 8-88316 | 4/1996 |
| JP | A-10-50930 | 2/1998 |
| JP | A-2002-164665 | 6/2002 |
| JP | A-2002-305364 | 10/2002 |
| JP | A-2002-368026 | 12/2002 |
| JP | A-2003-298005 | 10/2003 |

* cited by examiner

COLLECTIVE MOUNTING METHOD OF ELECTRONIC COMPONENTS AND MANUFACTURING METHOD OF ELECTRONIC COMPONENT-EMBEDDED SUBSTRATE

BACKGROUND OF THE INVENTION

The present invention relates to a method for mounting electronic components on an insulating layer, and a method for manufacturing an electronic component-embedded substrate.

In general, a substrate (an electronic component-embedded substrate) on which electronic components such as semiconductor devices (an IC and another semiconductor active device) are mounted has a structure in which the semiconductor devices (dies) having a bare chip state are fixed to the substrate including a single resin layer or a plurality of resin layers, and to meet demands for high performance and miniaturization of an electronic device, development of a module has been advanced on which active components such as the semiconductor devices and passive components such as resistances and capacitors are highly densely mounted.

In recent years, with regard to portable devices typified by a portable terminal such as a cellular phone, mounting with a density much higher than every before has been demanded, and these days, especially a demand for thinning has risen. On the other hand, also with regard to the electronic component-embedded substrate for use in such a portable device, higher densification and thinning are earnestly demanded, and further thinning of the electronic components themselves also rapidly advances.

In such a situation, a highly dense mounted module constituted in which electronic components such as a plurality of semiconductor devices are embedded in one module is put to practical use, and a module in which a plurality of semiconductor bare chips are laminated in multiple stages on one surface of the substrate is disclosed in, for example, Japanese Patent Application Laid-Open No. 8-88316.

In addition, to assemble the electronic components such as the plurality of semiconductor devices in multiple stages is one means for the highly dense mounting, but in view of arrangement with passive components such as the resistances and capacitors to be mounted on the module, a problem of heat discharge accompanying a high-speed operation of the semiconductor device and the like, or in a case where there is not any strict restriction on a planar dimension of the substrate, the plurality of electronic components are sometimes arranged on a single layer. Moreover, since an outer size of each semiconductor bare chip is reduced, there are sometimes demanded further thinning due to the highly dense mounting in a horizontal direction and higher densification due to the arrangement of the plurality of electronic components in the multiple stages and the respective layers. Furthermore, as disclosed in Japanese Patent Application Laid-Open No. 8-88316, to mount the electronic components in the multiple stages, after bonding and fixing one electronic component to a base or the like, it is unavoidably necessary to bond and fix the next-stage electronic component on the one component. Therefore, much time is required for manufacturing, and this is disadvantageous from a viewpoint of production efficiency.

However, it cannot necessarily be said that the mounting of the electronic components on a single layer, nit in the multiple stages, is advantageous from the viewpoint of the production efficiency. That is, as disclosed in, for example, Japanese Patent Application Laid-Open No. 8-88316, to fix the semiconductor devices to arrangement portions of the base or the like, the devices need to be fixed to the portions one by one using an adhesive.

Moreover, a method is known in which a plurality of electronic components are arranged on a resin layer by use of an unhardened resin layer as the adhesive, and the resin layer is hardened to fix both the components and the layer. However, in a case where it is prevented that foaming (a void) is generated in a bonding interface between both the components and the layer and that a securing property deteriorates, after the electronic components are pressed to the resin layer for a sufficient time, the resin layer needs to be hardened. For this purpose, a method is employed in which, for example, a ceramic-made grasping tool (e.g., a jig such as a collet for use in a die bonder unit) is usually attached to one surface of each electronic component to hold the electronic component by adsorption or the like, an opposite surface of the electronic component in this state is allowed to abut on the resin layer or the like and tentatively set, further the pressure is applied to the front surface of the electronic component with the grasping tool to attach and press the component to the resin layer or the like, and this procedure is performed on the plurality of electronic components in order.

However, in such a method, several seconds to several ten seconds are required for pressing one electronic component to the resin layer. Therefore, for example, to mount a large number of electronic components on the resin layer of the substrate having a comparatively large size, much time including another handling time is required for completion (according to findings of the present inventor, it is not rare that several hours or more are required). During this mounting, since the unhardened resin for bonding is retained in a heated state to a certain degree in order to maintain flexibility suitable for the bonding, and is exposed to the atmosphere, the resin is gradually hardened, absorbs humidity and is thus variously influenced. In this case, from the start of the mounting of the electronic components on the resin layer to the completion of the mounting, with an elapse of time, the resin state (physical property) changes (deteriorates), and hence a mounting defect (a bonding defect and generation of the void) of the electronic components on the resin layer might occur.

SUMMARY OF THE INVENTION

The present invention has been developed in view of such a situation, and an object thereof is to provide a collective mounting method of electronic components in which when a plurality of electronic components are mounted on an insulating layer including a single resin layer, the plurality of electronic components can uniformly be pressed and fixed to the insulating layer in a short time without being influenced by a change of a resin state, and a manufacturing method of an electronic component-embedded substrate.

To achieve the above object, a collective mounting method of electronic components according to the present invention is a method in which a plurality of electronic components are collectively pressed and fixed to one (the same) insulating layer, comprising: a disposing step of disposing the plurality of electronic components on an unhardened resin which is to form the insulating layer; a pressurizing step of simultaneously pressurizing the plurality of electronic components via a pressure medium; and a heating step of heating and hardening the resin to form the insulating layer. It is to be noted that the "unhardened resin which is to form the insulating layer" in the present invention includes not only the whole resin to form the insulating layer but also an unhardened adhesive (paste, sheet or the like) for bonding and fixing the electronic components to a base such as the substrate.

In such a collective mounting method of the electronic components, first in the disposing step, the plurality of electronic components are disposed on the unhardened resin by appropriate means. At this time, the individual electronic components are merely tentatively set on the resin in a non-pressurized state, and much time is not required for completing the disposing of the plurality of electronic components. Then, after the plurality of electronic components are tentatively set, in the pressurizing step, the plurality of electronic components are simultaneously pressurized and pressed to the resin. Therefore, the plurality of electronic components can satisfactorily be pressed to the unhardened resin in a short time. Then, the heating step is performed, whereby the resin to which the plurality of electronic components have satisfactorily and uniformly been pressed hardens to form the insulating layer, so that the plurality of electronic components are collectively fixed to the insulating layer with a sufficient securing force in the short time.

Moreover, it is preferable that the pressurizing step isotropically pressurizes the plurality of electronic components. In this case, since the plurality of electronic components are isotropically pressurized (so-called isotropic pressurizing) via the pressure medium, a uniform pressure acts on the individual electronic components, the components are simultaneously and collectively pressurized, and hence the state of the resin hardly changes (deteriorates).

Furthermore, it is preferable that at least a part of the pressurizing step and at least a part of the heating step, preferably all of both the steps are simultaneously performed, in other words, hot isotropic pressurizing is performed. In this case, a time required for fixing and mounting the plurality of electronic components on the insulating layer is further reduced.

In this case, it is preferable that the pressurizing step is performed at least while the resin softens in the heating step, that is, from a time when the plurality of electronic components are disposed on the resin to a time when the resin hardens. Then, even on conditions that the respective electronic components might sink in the resin owing to their weights to be deformed, the respective electronic components are isotropically pressurized during the step, and hence such deformation of the electronic components due to their weights is effectively prevented.

Furthermore, it is more preferable that the pressurizing step isotropically pressurizes the plurality of electronic components and the resin in at least peripheries of the electronic components. At this time, it is especially preferable to simultaneously perform the isotropic pressurizing of both the components and the resin. In this case, since the resin around the plurality of disposed electronic components is also pressed with a pressure equal to that for pressing the electronic components, protruding and rising of the resin from peripheral edge portions of the electronic components are effectively prevented, and deformation of the electronic components is further inhibited.

In addition, it is more preferable that the pressurizing step uses, as the pressure medium, a gas or a liquid (including a liquid-like body) which covers the plurality of electronic components and the periphery of the resin, because the plurality of electronic components are securely and isotropically pressurized to further easily realize a uniformly pressed state. Specifically, for example, a method may be used in which the unhardened resin on which the plurality of electronic components have been disposed is introduced in a pressurizing container where the gas (an atmospheric gas) or the liquid is stored, and the inside of the container is pressurized. In this case, the gas or the liquid in the container is heated with an appropriate temperature gradient, whereby heat is applied to the resin via the gas or the liquid, so that the pressurizing step and the heating step are easily simultaneously performed with respect to the electronic components and the resin.

Alternatively, it is preferable that the pressurizing step uses, as the pressure medium, a film body or an elastic body which are arranged at least so as to cover all bare surfaces of the plurality of electronic components and so as to come in close contact with all the bare surfaces, and pressurizing means for applying a pressure to the film body or the elastic body, because the respective electronic components can sufficiently isotropically be pressurized.

Specifically, for example, a method may be used in which the whole upper portions of the plurality of electronic components disposed on the unhardened resin are covered with a film (e.g., a thin film made of a resin or a rubber) having a stretching property and flexibility, and further the pressure is applied to the film via the pressure medium including a fluid such as the gas or the liquid. In other words, a method may be used in which the plurality of electronic components and the film are collectively attached (laminated) and simultaneously and isotropically pressurized. In consequence, the pressurizing step can simultaneously be performed with respect to the plurality of electronic components and the resin.

Moreover, a method may be used in which air is discharged from a space between the film and the plurality of electronic components, a pressure in the space is reduced to collectively and closely seal the plurality of electronic components with the film (so-called collective vacuum laminating is performed), and the plurality of electronic components are simultaneously and isotropically pressurized from the outside of the film via the film by an atmospheric pressure. In this case, the plurality of electronic components and the whole unhardened resin may be stored in a bag-like film, a pressure in the film may be reduced to closely seal the plurality of electronic components and the whole resin with the film, and the plurality of electronic components and the whole resin may simultaneously and isotropically be pressurized from the outside of the film via the film by the atmospheric pressure. Even in this case, the pressurizing step can simultaneously be performed with respect to the plurality of electronic components and the resin.

Furthermore, a manufacturing method of an electronic component-embedded substrate according to the present invention comprises a semiconductor collective fixing step which executes the mounting method of the electronic components according to the present invention, an insulating layer forming step of forming a further insulating layer on the plurality of fixed electronic components, and a wiring layer forming step of forming a wiring layer to be electrically connected to the plurality of electronic components on the further insulating layer.

According to the present invention, since the plurality of electronic components disposed on the unhardened resin are simultaneously, collectively and isotropically pressurized via the pressure medium, the plurality of electronic components can uniformly be pressed and fixed to the insulating layer in a short time without being influenced by a change of a resin state. Therefore, it is possible to prevent a mounting defect at a time when the plurality of electronic components is mounted on the same insulating layer.

DESCRIPTION OF THE PREFERRED EMBODIMENT

Figure 1:
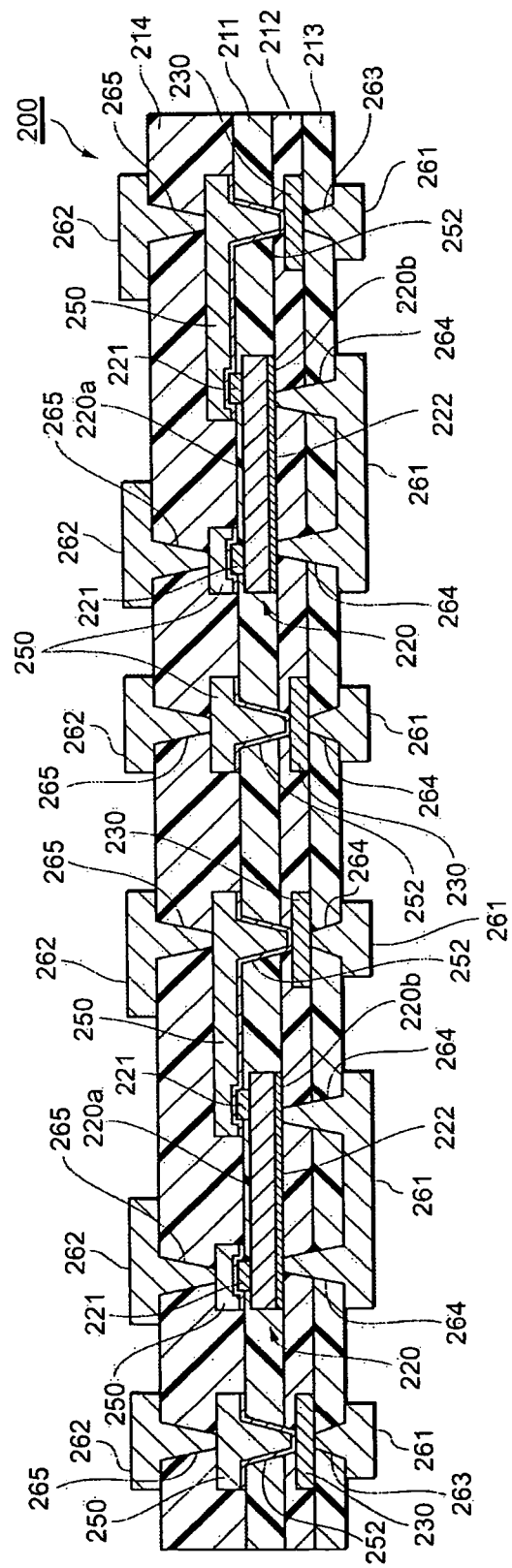
FIG. 1 is a sectional view showing a main part of one example of an electronic component-embedded substrate manufactured by a manufacturing method of the electronic component-embedded substrate according to the present invention.

An embodiment of the present invention will hereinafter be described in detail. It is to be noted that the same element is denoted with the same reference numeral, and redundant description is omitted. Moreover, it is assumed that vertical and horizontal positional relations and the like are based on a positional relation shown in the drawing, unless it is especially mentioned. Furthermore, a dimensional ratio of the drawing is not limited to a shown ratio. The following embodiment merely illustrates the present invention, and it is not intended that the present invention is limited to the embodiment only. In addition, the present invention can variously be modified without departing from the scope.

FIG. 1 is a sectional view showing a main part of one example of an electronic component-embedded substrate manufactured by a manufacturing method of the electronic component-embedded substrate according to the present invention.

In a semiconductor-embedded substrate 200 (an electronic component-embedded substrate), a plurality of (two in the drawing) semiconductor devices 220 (electronic components) as semiconductor components such as semiconductor ICs (dies) in a bare chip state are buried in a resin layer 211 among laminated resin layers 211 to 214. The substrate includes alignment marks 230 formed in the resin layer 212 (an insulating layer) as an underlayer of the devices, various wiring patterns 250, 261 and 262 including conductors electrically connected to the semiconductor devices 220, and through electrodes 252, 263 to 265 connected to these wiring patterns.

Figure 21:
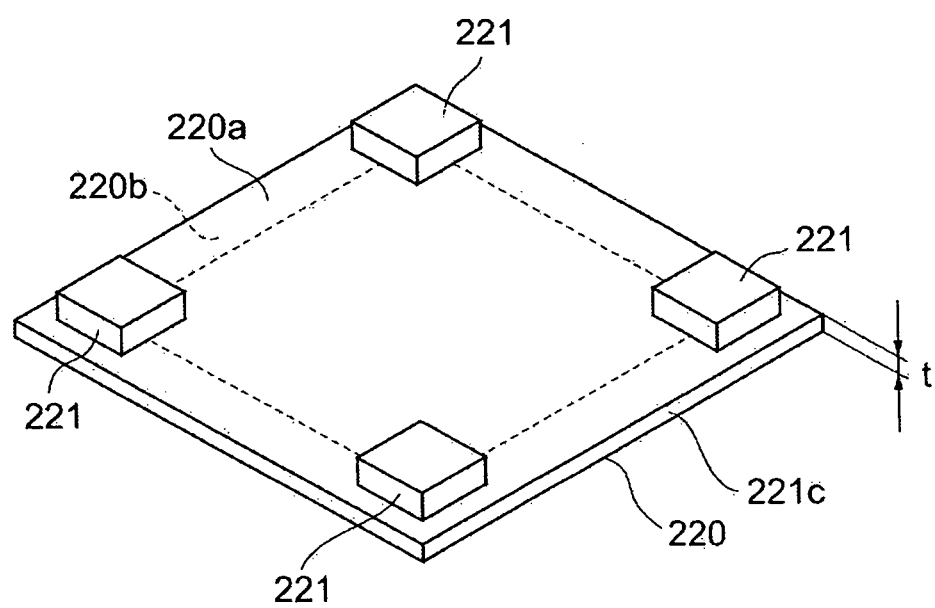
FIG. 21 is a perspective view showing a schematic structure of a semiconductor device 220.

Here, FIG. 21 is a perspective view showing a schematic structure of the semiconductor device 220. The semiconductor device 220 has a large number of land electrodes (not shown) and bumps 221 at a substantially rectangular plate-like main surface 220a of the device. It is to be noted that in the drawing, the bumps 221 are shown at only four corners, and the other bumps 221 are omitted. There is not any special restriction on a type of the semiconductor device 220, but an efficient heat release countermeasure against heat generated in the semiconductor device 220 is performed as described later, and hence a digital IC having a very high operation frequency or the like, for example, CPU or DSP is preferably usable.

Furthermore, there is not any restriction, but a back surface 220b of the semiconductor device 220 is polished, whereby a thickness t (a distance from the main surface 220a to the back surface 220b) of the semiconductor device 220 is set to be smaller than that of a usual semiconductor device, and is set to, for example, preferably 200 μm or less, more preferably about 20 to 50 μm. On the other hand, to further thin the semiconductor device 220, it is preferable that the back surface 220b is subjected to a surface roughing treatment such as etching, plasma treatment, laser irradiation, blast polishing, buff polishing or chemical treatment.

It is to be noted that it is preferable to collectively polish the back surfaces 220b of the semiconductor devices 220 with respect to a large number of semiconductor devices 220 in a wafer state and to afterward divide a wafer into the individual semiconductor devices 220 by dicing. In a case where the wafer is cut and separated into the individual semiconductor devices 220 by dicing before thinning the devices by polishing, the back surface 220b may be polished in a state in which the main surface 220a of the semiconductor device 220 is covered with a resin or the like.

Moreover, each of the bumps 221 is one type of conductive protrusion, and there is not any special restriction on a type of the bump, but examples of the bump include various bumps such as a stud bump, a plate bump, a metal plating bump and a ball bump. It is to be noted that the plate bumps are shown in the drawing.

When the stud bump is used as the bump 221, a bump of gold (Au) or copper (Cu) may be formed by wire bonding. When the plate bump is used, the bump may be formed by plating, sputtering or evaporation. When the metal plating bump is used, the bump may be formed by metal plating. When the ball bump is used, the bump may be formed by disposing a solder ball on a land electrode 221a, and then melting this ball, or by printing a cream solder on the land electrode, and then melting this solder. Alternatively, there may be used a conical or columnar bump formed by screen-printing a conductive material and hardening this material, or a bump formed by printing a nano-paste and heating the paste to sinter the paste.

There is not any special restriction on a metal type usable in the bump 221, but examples of the metal type include gold (Au), silver (Ag), copper (Cu), nickel (Ni), tin (Sn), chromium (Cr), an alloy of nickel and chromium and a solder, and it is preferable to use copper among these metals. When copper is used as a material of the bump 221, as compared with a case where gold is used, a high bonding strength with respect to the land electrode 221a can be obtained, and reliability of the semiconductor device 220 is improved.

Moreover, a dimensional shape of the bump 221 can appropriately be set based on an interval (a pitch) between the land electrodes 221a. When the pitch between the land electrodes 221a is, for example, 100 μm, a maximum diameter of the bump 221 may be set to about 10 to 90 μm, and a height may be set to about 2 to 100 μm. It is to be noted that after the wafer is cut and separated into the individual semiconductor devices 220 by the dicing, the bumps 221 may be bonded to the respective land electrodes 221a by use of a wire bonder.

As shown in FIG. 1, in the semiconductor devices 220 according to the present embodiment, the main surfaces 220a of the plurality of semiconductor devices 220 are directly covered with the resin layer 211 as the same layer, and the back surfaces 220b of the plurality of semiconductor devices 220 are directly covered with the resin layer 212 as the same layer. The bumps 221 of the respective semiconductor devices 220 are provided so as to protrude from the surface of the resin layer 211, and connected to the wiring patterns 250 formed at these protruding portions on the resin layer 214.

Moreover, a metal layer 222 is formed on the back surface 220b of each of the semiconductor devices 220. This metal layer 222 functions as a heat release path of heat generated in a case where the semiconductor device 220 operates, further effectively prevents cracks which might be generated in the back surface 220b of the semiconductor device 220 owing to heat stress or the like, and performs a role to improve a handling property of the semiconductor device 220, although it is increasingly difficult to handle the device because the device is thinned.

Each metal layer 222 is connected to the wiring pattern 261 formed on the outermost layer via a through electrode 264 formed so as to extend through the resin layers 212, 213. This through electrode 264 is a heat release path of the heat generated in the semiconductor device 220, and the heat is efficiently released to a base such as a mother board through these electrodes.

Here, specific examples of a material for use in the resin layers 211 to 214 include a vinyl benzil resin; a polyvinyl benzyl ether compound resin; a bismaleymidtriazine resin (a BT resin); a polyphenylether (polyphenylene ether oxide) resin (PPE, PPO); a cyanate ester resin; an epoxy+active ester hardened resin; a polyphenylene ether resin (a polyphenylene oxide resin); a hardening polyolefin resin; a benzocyclobutene resin; a polyimide resin; an aromatic polyester resin; an aromatic liquid crystal polyester resin, a polyphenylene sulfide resin; a polyether imide resin; a polyacrylate resin; a polyether ether ketone resin; a fluorine resin; an epoxy resin; a single body of a phenol resin or a benzoxazin resin; a material in which, to one of the resins, silica, talc, calcium carbonate, magnesium carbonate, aluminum hydroxide, magnesium hydroxide, aluminum borate whisker, potassium titanate fiber, alumina, glass flake, glass fiber, tantalum nitride, aluminum nitride or the like is added; a material in which, to one of these resins, there is added metal oxide powder including at least one of metals such as magnesium, silicon, titanium, zinc, calcium, strontium, zirconium, tin, neodymium, samarium, aluminum, bismuth, lead, lanthanum, lithium and tantalum; a material in which one of these resins is blended with a resin fiber such as glass fiber or aramid resin; and a material in which one of these resins is impregnated with glass cloth, aramid fiber, non-woven cloth or the like. The material can appropriately be selected and used from a viewpoint of an electric characteristic, a mechanical characteristic, water absorption, resistance to reflow or the like.

Next, one example of a manufacturing method of the semiconductor-embedded substrate 200 will be determined with reference to the drawings. FIGS. 2 to 17 are step diagrams showing one example of a procedure of manufacturing the semiconductor-embedded substrate 200 shown in FIG. 1.

Figure 2:
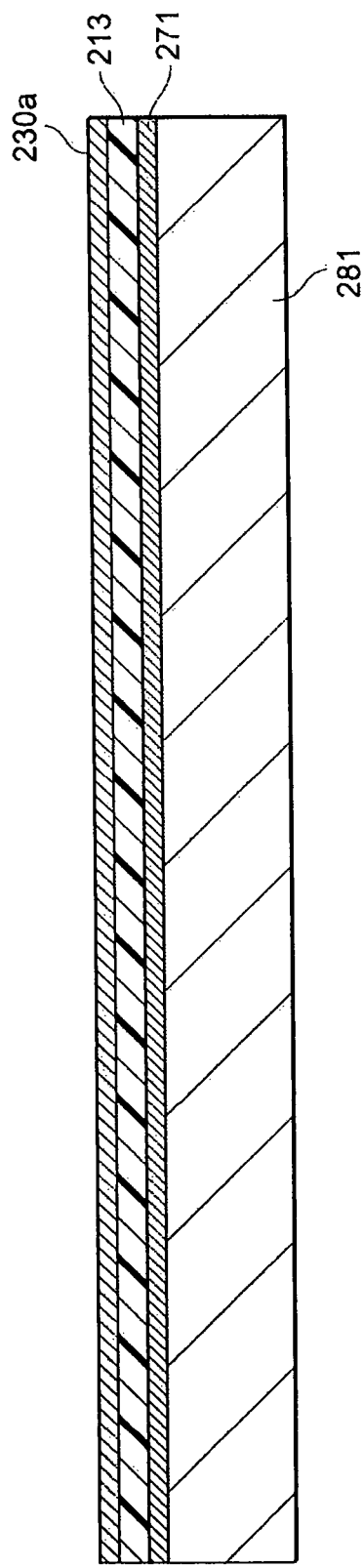
FIG. 2 is a step diagram showing one example of a procedure to manufacture a semiconductor-embedded substrate 200.
Figure 3:
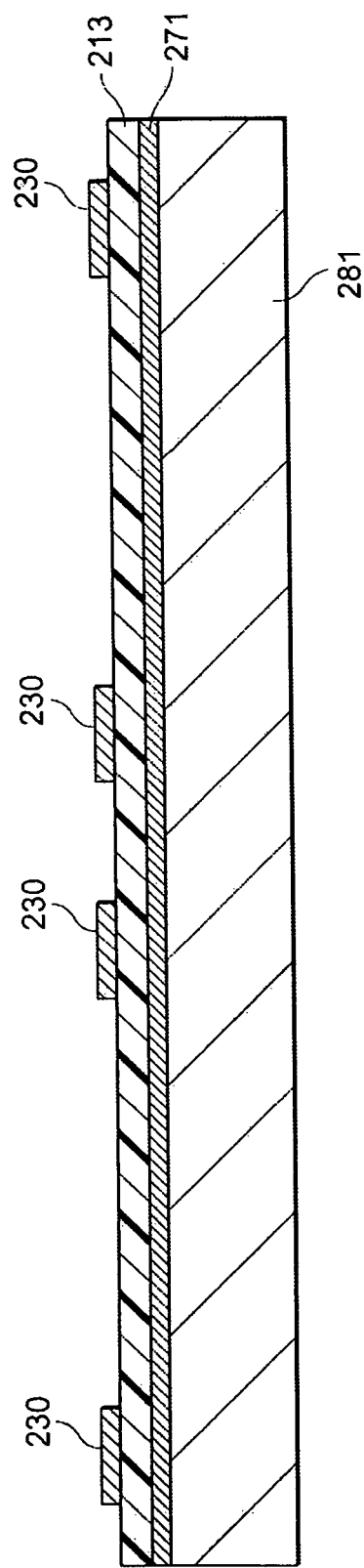
FIG. 3 is a step diagram showing one example of the procedure to manufacture the semiconductor-embedded substrate 200.

First, the flat plate-like resin layer 213 provided with conductive layers 230a, 271 formed on both surfaces thereof is prepared, and a support substrate 281 is attached to one surface (a conductive layer 271 side) (FIG. 2). Subsequently, the conductive layer 230a is patterned to thereby form the alignment marks 230 (FIG. 3). The alignment marks 230 may be used as a wiring pattern in the semiconductor-embedded substrate 200.

Figure 4:
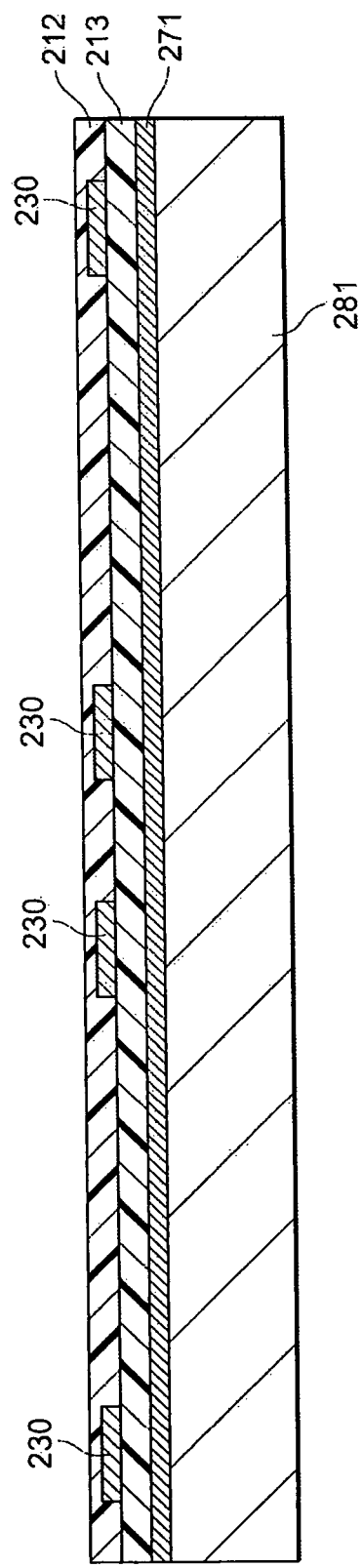
FIG. 4 is a step diagram showing one example of the procedure to manufacture the semiconductor-embedded substrate 200.
Figure 5:
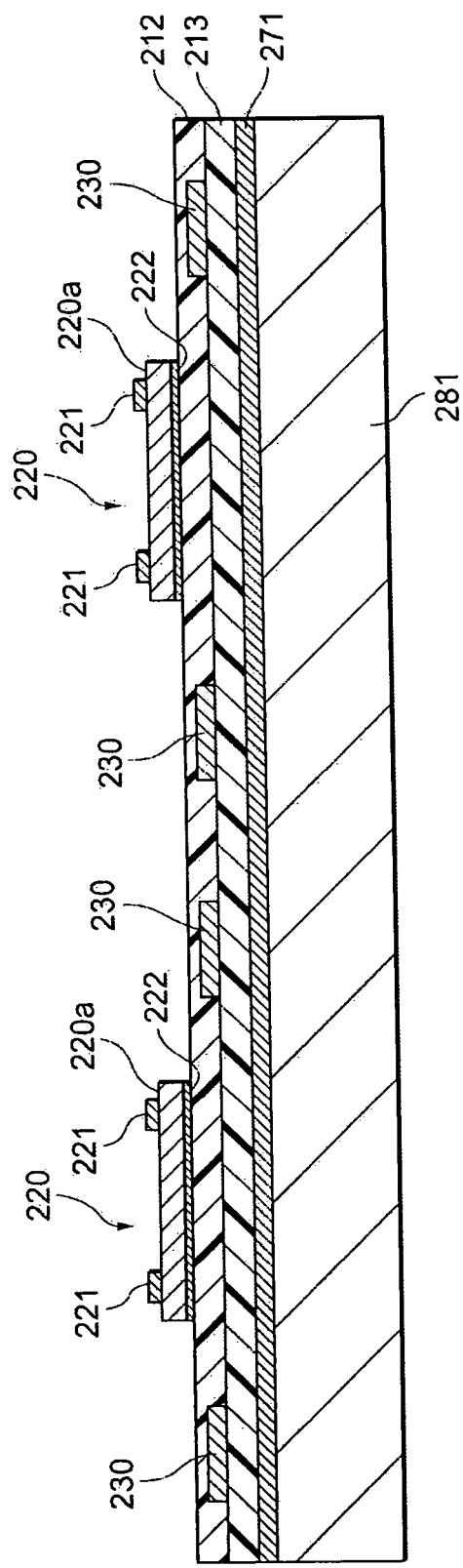
FIG. 5 is a step diagram showing one example of the procedure to manufacture the semiconductor-embedded substrate 200.

Subsequently, the resin layer 213 is coated with an unhardened resin for forming the resin layer 212 by an appropriate technique, and the unhardened resin layer 212 is formed so as to cover the alignment marks 230 (FIG. 4). Furthermore, while alignment is performed using the alignment marks 230, the semiconductor device 220 held with a grasping tool such as a die bonder (not shown) is successively disposed and tentatively set (FIG. 5; a disposing step). In the present embodiment, each semiconductor device 220 is mounted on the resin layer 212 by a face-up system, that is, so as to dispose the main surface 220a upwards. In consequence, the back surface 220b of each semiconductor device 220 abuts on the resin layer 212, and is completely covered.

Figure 6:
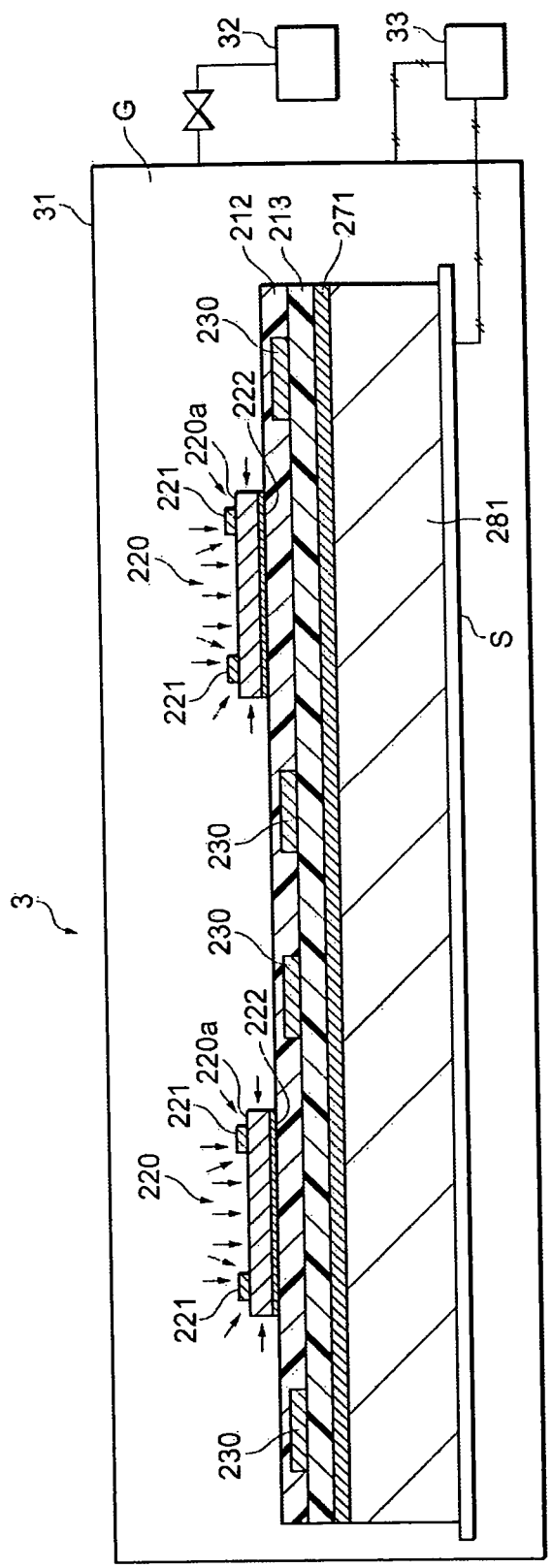
FIG. 6 is a step diagram showing one example of the procedure to manufacture the semiconductor-embedded substrate 200.
Figure 7:
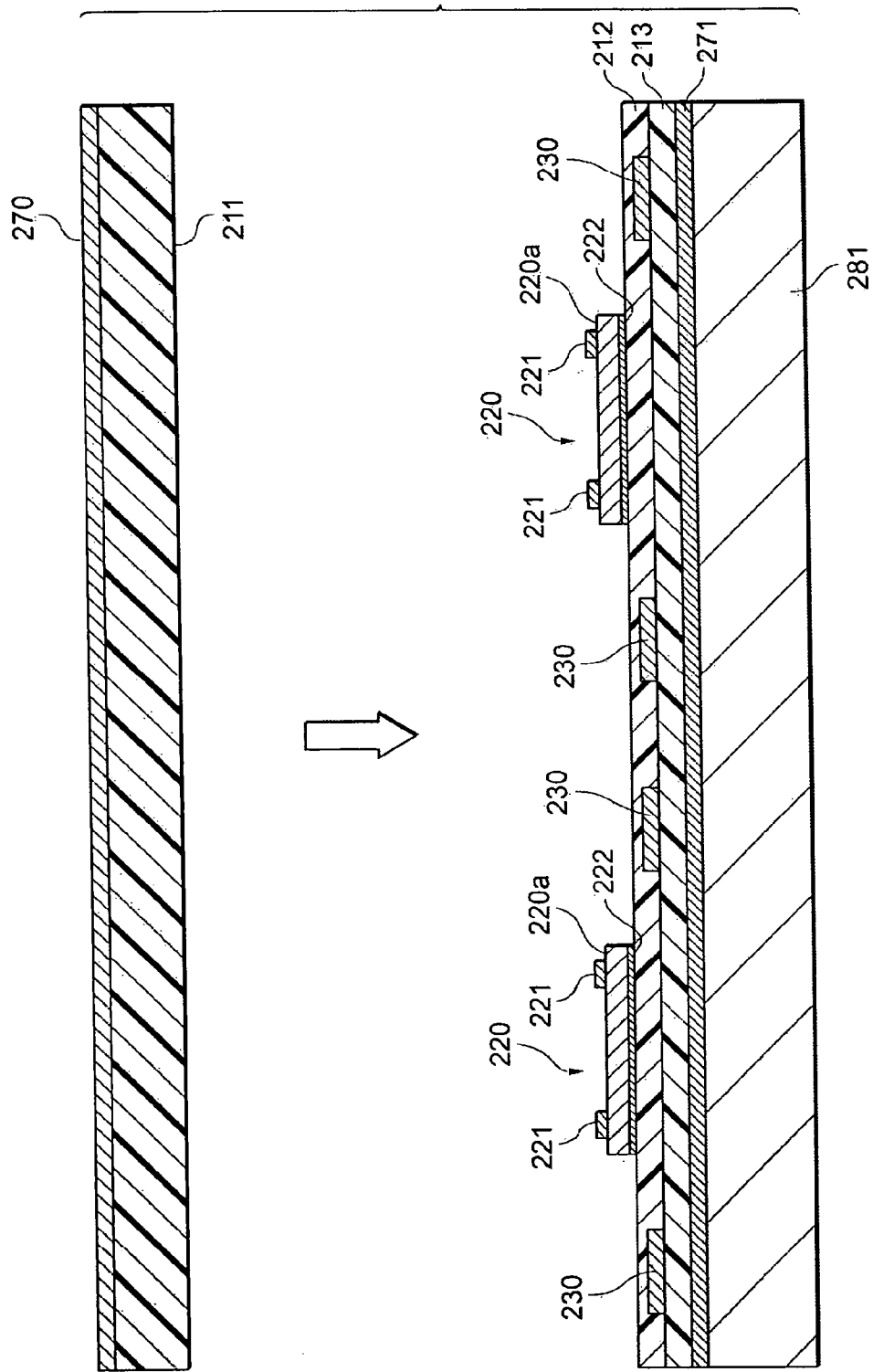
FIG. 7 is a step diagram showing one example of the procedure to manufacture the semiconductor-embedded substrate 200.

Subsequently, the plurality of semiconductor devices 220 once tentatively set on one unhardened resin layer 212 are stored in the container 31 of the pressurizing and heating unit 3, and left to stand still on a support base S (FIG. 6). The pressurizing and heating unit 3 is stored in the container 31 connected to a pressurizing machine 32 having a compression unit such as a compressor and a heating machine 33 such as an electric heater, and can be pressurized and heated using an internal gas G of the container 31 as a medium.

Then, the gas compressed using the pressurizing machine 32 is injected into a unit tank to pressurize the internal gas G, whereby the plurality of semiconductor devices 220 are simultaneously, collectively and isotropically pressurized, and the back surfaces 220b of the respective semiconductor devices 220 are simultaneously and collectively pressed to the resin layer 212 (a pressurizing step). During the pressurizing, the heating machine 33 is operated to heat an internal atmosphere of the container 31 (including the support base S as the case may be), whereby the resin layer 212 is once softened to such an extent that bonding is conveniently performed, and then further thermally hardened (a heating step). The isotropic pressurizing step and the heating step are simultaneously performed in this manner, whereby the plurality of semiconductor devices 220 and the resin layer 212 are subjected to so-called hot isotropic pressurizing, and the plurality of semiconductor devices 220 are simultaneously and collectively brought into close contact with the resin layer 212 to fix the devices. The disposing step shown in FIG. 5, and the pressurizing step and the heating step shown in FIG. 6 constitute a semiconductor collective fixing step which executes a mounting method of electronic components according to the present invention. It is to be noted that a plurality of arrows in FIG. 6 schematically indicate that the plurality of semiconductor devices 220 are isotropically and uniformly pressurized. At this time, the resin layer 212 around the plurality of semiconductor devices 220 is simultaneously and isotropically pressurized with an equal pressure, but arrows indicating this state are omitted from the drawing. This also applies to FIGS. 18 to 20 described later.

Here, pressurizing conditions and heating conditions in the pressurizing and heating unit 3 can appropriately selected in accordance with a type and a property of the resin layer 212, a type and a dimensional shape of the semiconductor device 220, a capacity and a characteristic of the pressurizing and heating unit 3 and the like, and there is not any special restriction. However, as the pressurizing and heating conditions, for example, the unhardened resin layer 212 on which the semiconductor devices 220 have been disposed is stored beforehand in the container 31 at room temperature or at a temperature raised to a certain degree, and a pressure is raised from the atmospheric pressure to 0.5 MPa with an appropriate pressure gradient. In a state in which the pressure is retained, the temperature is raised to a melting point of the resin of the resin layer 212 or so (e.g., 60° C. to 100° C.) with an appropriate temperature gradient. And the semiconductor devices 220 are completely brought into close contact with the unhardened resin layer 212. Afterward, while the pressurized state is retained, the temperature is again raised to a hardening start temperature of the resin layer 212 as a thermosetting resin or more (e.g., 130° C. to 180° C.). After the temperature is retained for an appropriate time (e.g., several minutes to several ten minutes) until the resin layer 212 hardens, the temperature and the pressure are lowered to a predetermined temperature such as room temperature and a predetermined pressure such as the atmospheric pressure with appropriate temperature and pressure gradients, respectively.

Figure 8:
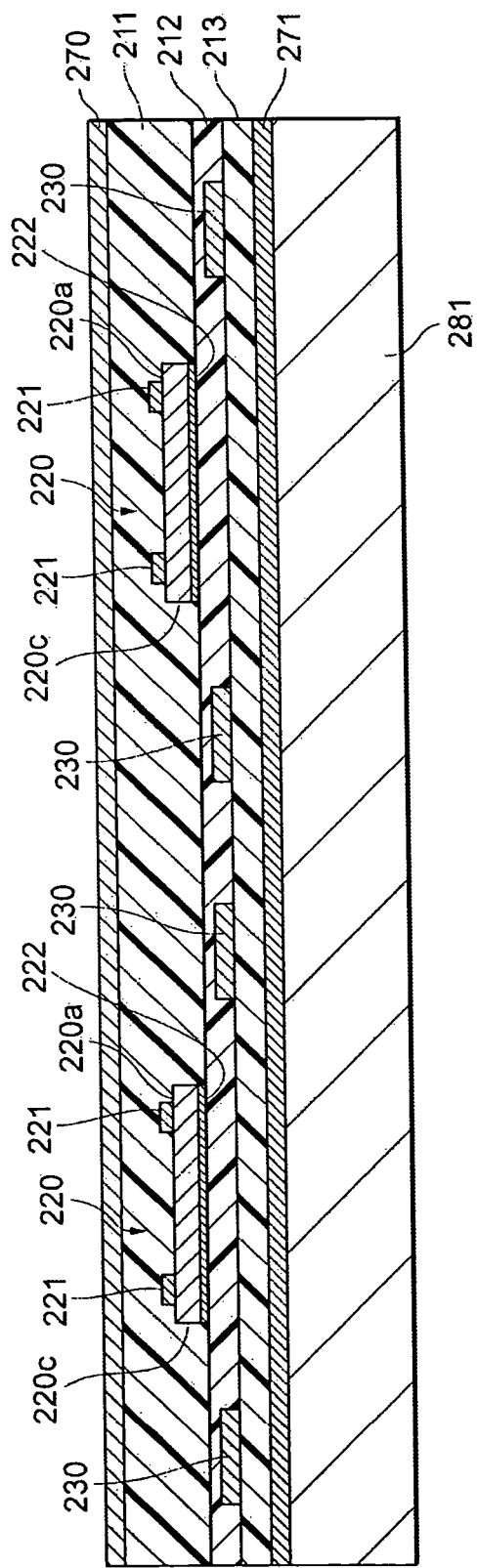
FIG. 8 is a step diagram showing one example of the procedure to manufacture the semiconductor-embedded substrate 200.

Subsequently, the plurality of semiconductor devices 220 fixed and mounted on the resin layer 212 are taken out of the pressurizing and heating unit 3, a laminated sheet constituted of the resin layer 211 and a resin layer 270 is superimposed so that the resin layer 211 faces the main surfaces 220a of the plurality of semiconductor devices 220 (FIG. 7), and both the devices and the sheet are pressed while heated. In consequence, the main surfaces 220a and side surfaces 220c of the plurality of semiconductor devices 220 are covered with the resin layer 211 (FIG. 8; an insulating layer forming step). That is, at this point, the plurality of semiconductor devices 220 are buried in the resin layer 211, and nipped between the resin layers 211 and 212.

Figure 9:
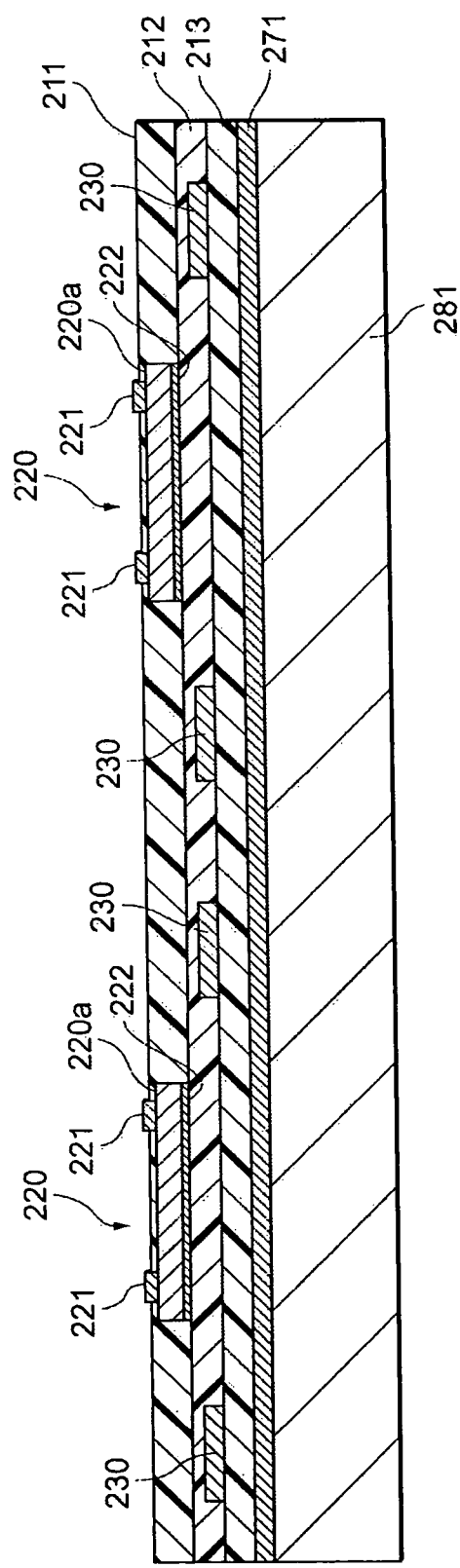
FIG. 9 is a step diagram showing one example of the procedure to manufacture the semiconductor-embedded substrate 200.

Then, after the resin layer 270 is removed, a surface layer of the resin layer 211 is etched by a wet blast process or the like, and in this case, an amount to be etched and etching conditions are appropriately regulated so that the bumps 221 provided on main surface 220a sides of the semiconductor devices 220 are protruded from the surface of the resin layer 211 (FIG. 9).

Figure 10:
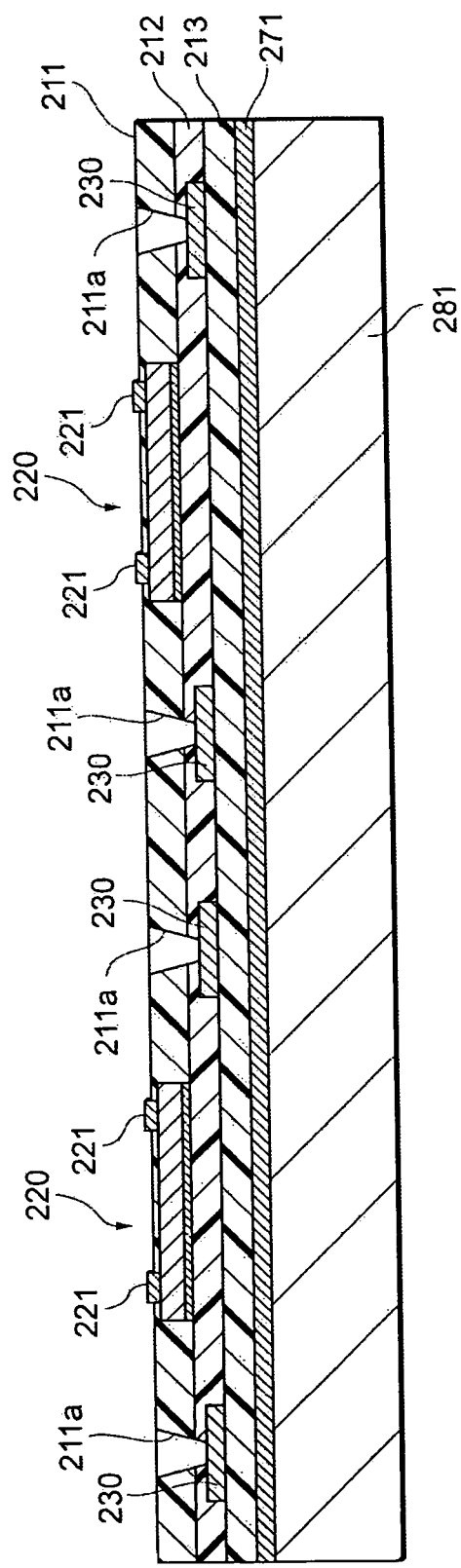
FIG. 10 is a step diagram showing one example of the procedure to manufacture the semiconductor-embedded substrate 200.

Subsequently, through holes 211a are formed so as to pass through the resin layers 211, 212 and reach the alignment marks 230 (FIG. 10). There is not any special restriction on a method for forming these through holes 211a, but examples of the method include a method of laser abrasion to directly irradiate the resin layer 211 with laser and a method for blasting such as sand blasting. In the latter case where the blasting is performed, a metal film such as a copper film is formed on the resin layer 211, and subjected to conformal processing by use of photolithography and etching, whereby a mask pattern having opening at positions to open the through holes 211a is formed, and then a blast treatment is performed using the metal film as a mask.

Figure 11:
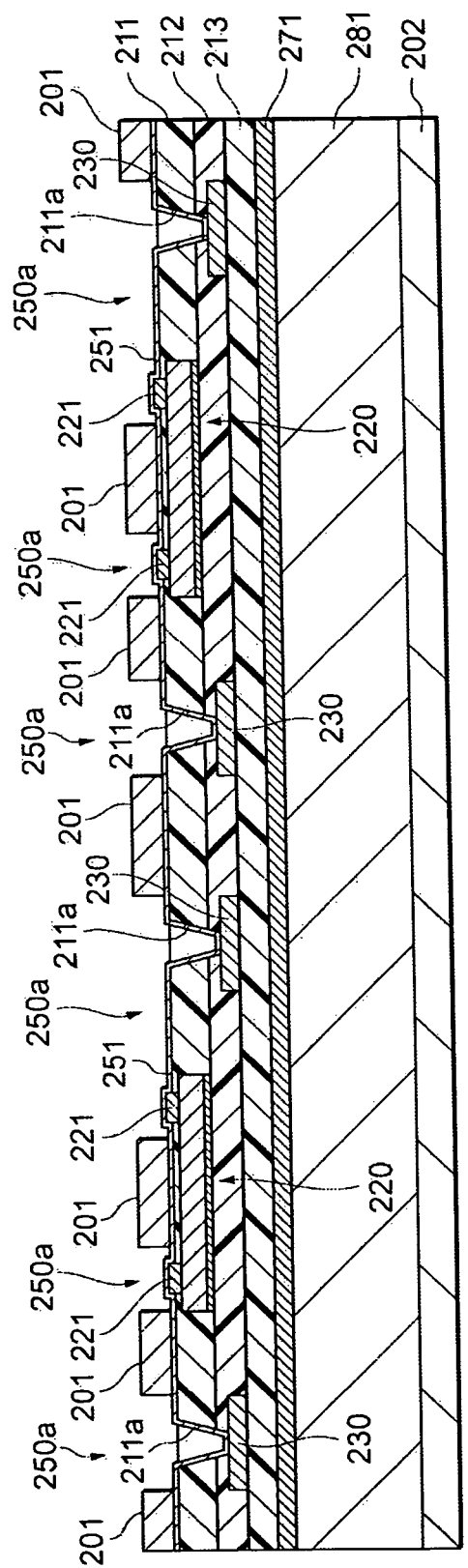
FIG. 11 is a step diagram showing one example of the procedure to manufacture the semiconductor-embedded substrate 200.

Subsequently, a thin conductive underlayer 251 is formed on the whole surface of the resin layer 211 including inner surfaces of the through holes 211a by a gas phase growth process such as a sputtering process. In consequence, portions of the alignment marks 230 exposed at bottom portions of the through holes 211a and protruding portions of the bumps 221 are covered with the conductive underlayer 251 (FIG. 11). It is to be noted that during the above-mentioned wet blast treatment of the resin layer 211, the bumps 221 are protruded from the surface of the resin layer 211, and hence a pretreatment such as removal of etching residuals does not have to be necessarily performed before forming the conductive underlayer 251, but the pretreatment may be performed if necessary.

Figure 12:
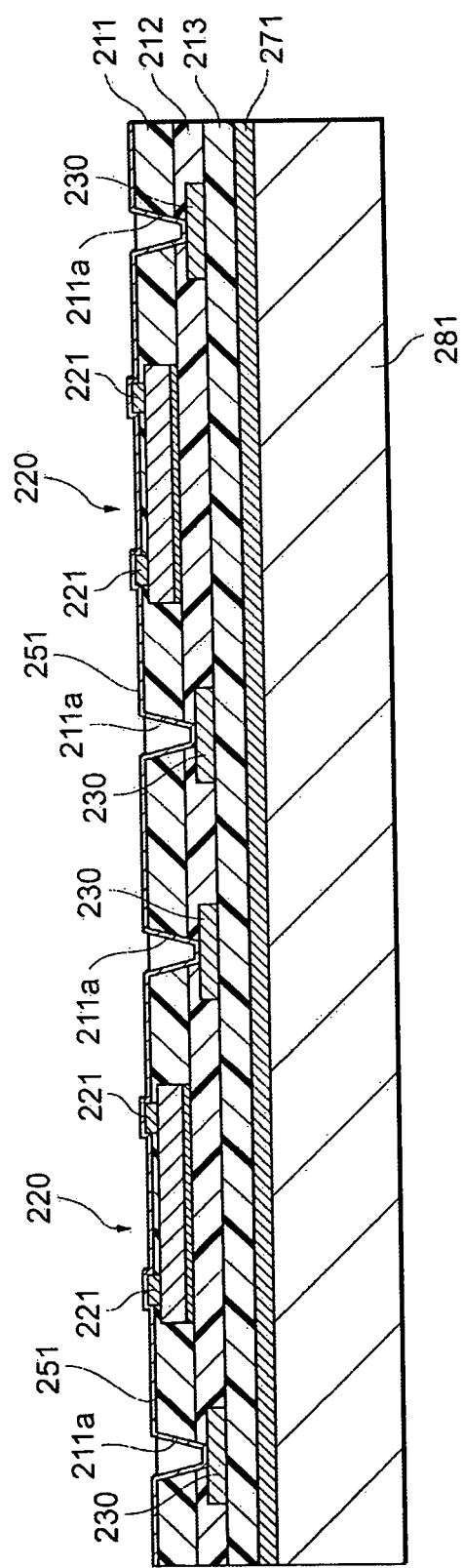
FIG. 12 is a step diagram showing one example of the procedure to manufacture the semiconductor-embedded substrate 200.

Subsequently, after photosensitive dry films 201, 202 are attached to both surfaces of a base, that is, an upper surface of the conductive underlayer 251 as shown and a lower surface of the support substrate 281 as shown, the dry film 201 is exposed using a photo mask (not shown), and the dry film 201 is removed from areas 250a in which the wiring patterns 250 are to be formed. In consequence, in the areas 250a where the wiring patterns 250 are to be formed, the conductive underlayer 251 is exposed (FIG. 12). At this time, without removing the dry film 202, a state in which the whole surface of the support substrate 281 is covered is retained.

Figure 13:
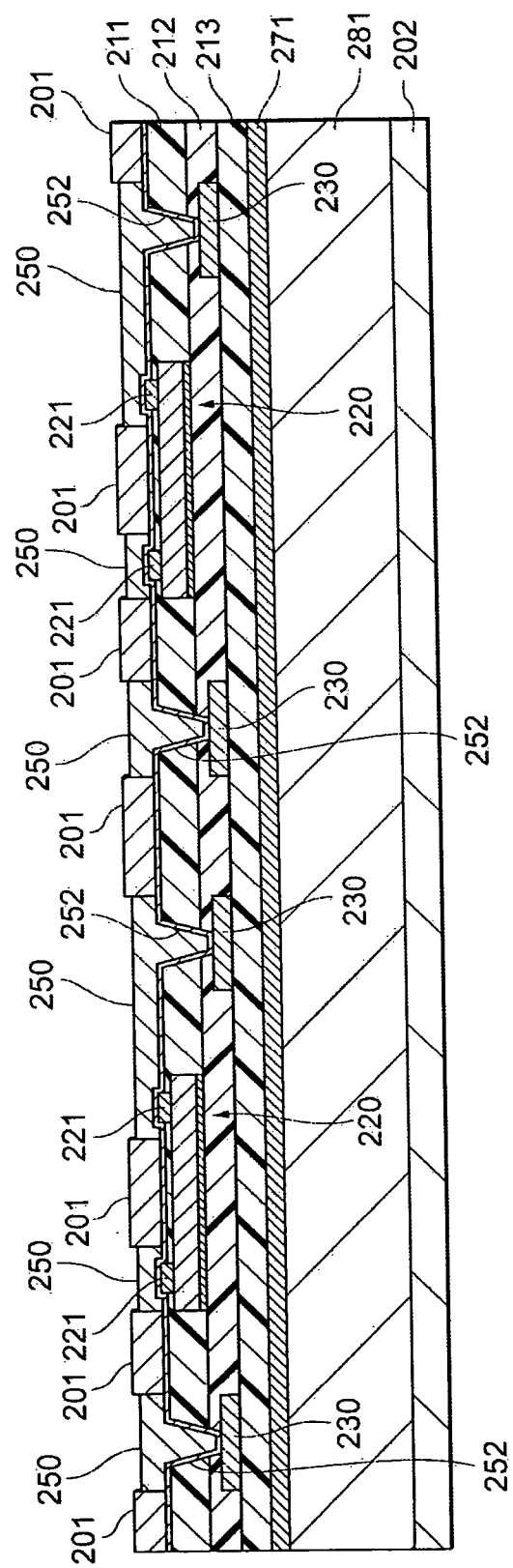
FIG. 13 is a step diagram showing one example of the procedure to manufacture the semiconductor-embedded substrate 200.

After a part of the conductive underlayer 251 is exposed in this manner, electrolytic plating is performed using the conductive underlayer 251 as a base, whereby the wiring patterns 250 are formed at the areas 250a in which the conductive underlayer 251 is exposed, and the through electrodes 252 are formed so as to fill in the through holes 211a (FIG. 13; a wiring layer forming step). In consequence, the through electrodes 252 are formed so as to extend through the resin layers 211, 212, and the alignment marks 230 are connected to the wiring patterns 250 via the through electrodes 252. At this time, since the whole surface of the support substrate 281 is covered with the dry film 202, any conductive layer is not formed by plating.

Figure 14:
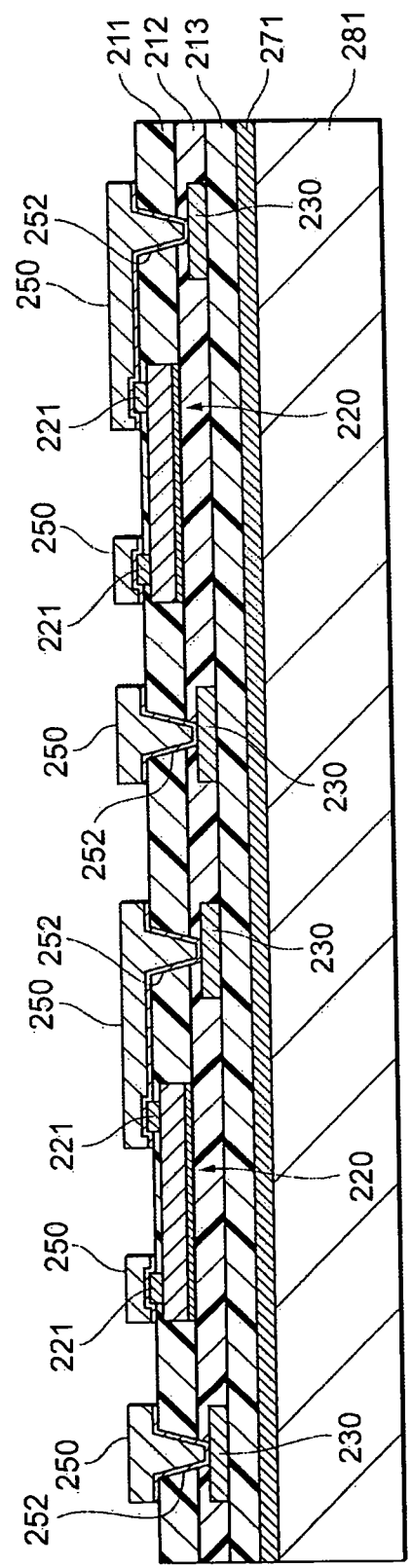
FIG. 14 is a step diagram showing one example of the procedure to manufacture the semiconductor-embedded substrate 200.
Figure 15:
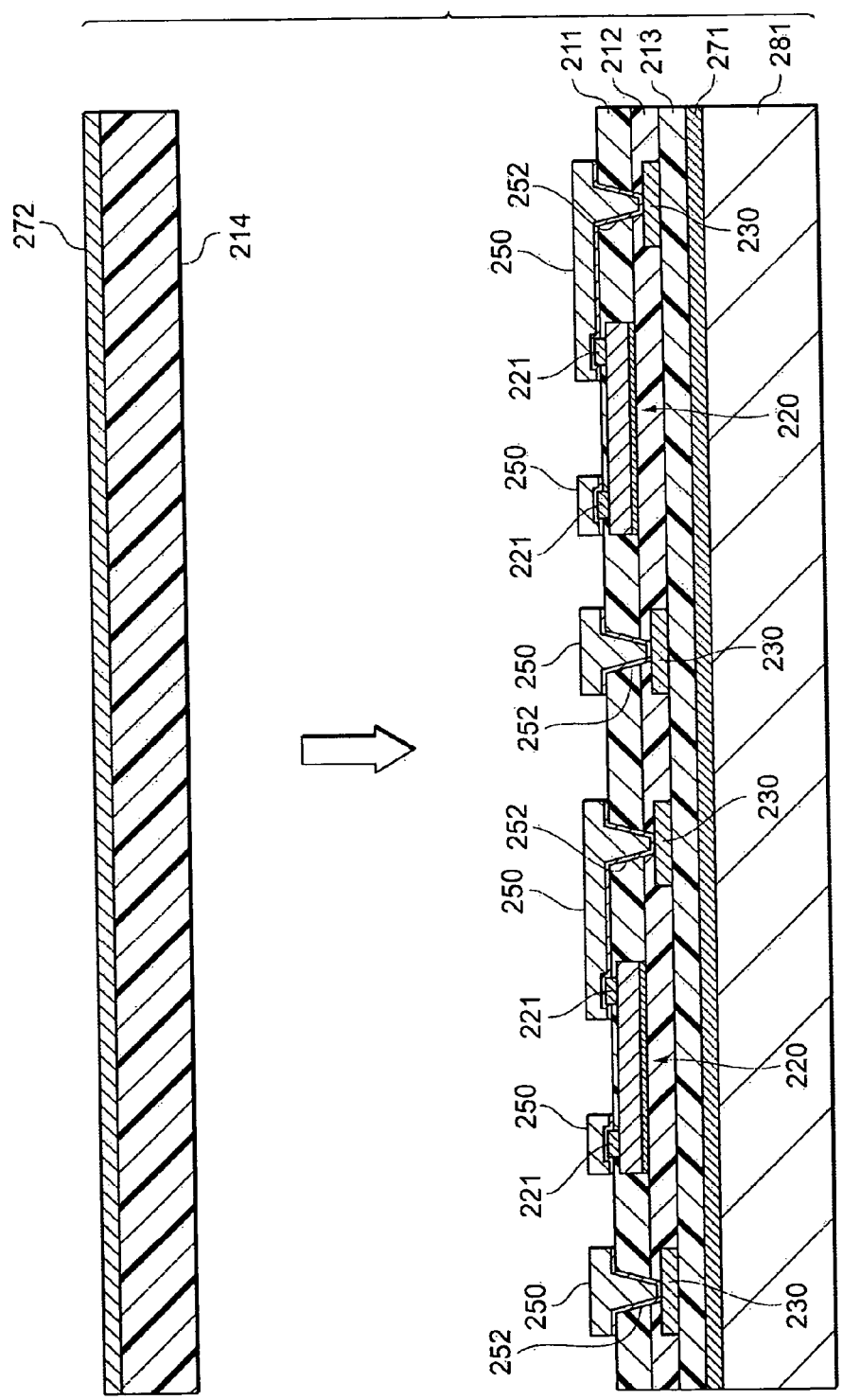
FIG. 15 is a step diagram showing one example of the procedure to manufacture the semiconductor-embedded substrate 200.

Subsequently, the dry films 201, 202 are peeled, and the unnecessary conductive underlayer 251 of a portion in which any wiring pattern 250 is not formed is removed (soft etching) using an etching liquid such as acid (FIG. 14).

Figure 16:
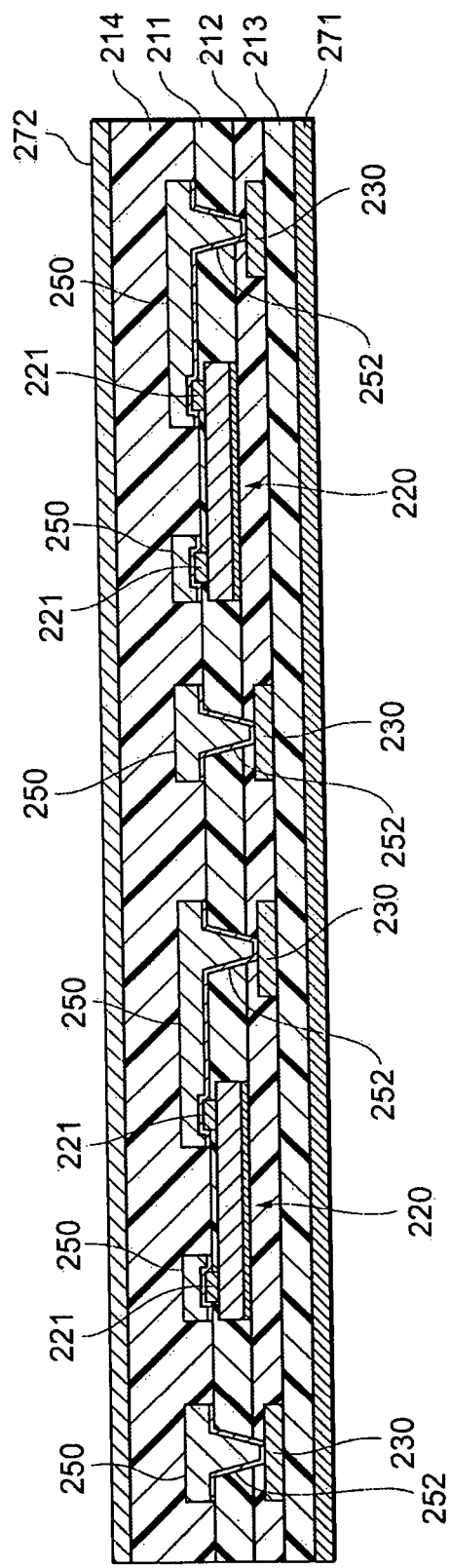
FIG. 16 is a step diagram showing one example of the procedure to manufacture the semiconductor-embedded substrate 200.

Then, a laminated sheet constituted of the resin layer 214 and a conductive layer 272 is superimposed so that the resin layer 214 faces the wiring patterns 250 (FIG. 15), and both the sheet and the patterns are pressed while heated. In consequence, after the wiring patterns 250 and the resin layer 211 are covered with the resin layer 214, the support substrate 281 is peeled (FIG. 16; an insulating layer forming step).

Furthermore, after the conductive layers 271, 272 are removed or thinned, through holes 213a, 213b and 214a are formed by an appropriate method such as the above-mentioned laser abrasion or the blast treatment. It is to be noted that the through holes 213a are through holes extending through the resin layer 213 to expose the alignment marks 230, the through holes 213b are through holes extending through the resin layers 213, 212 to expose the metal layer 222, and the through holes 214a are through holes extending through the resin layer 214 to expose the wiring patterns 250.

Figure 17:
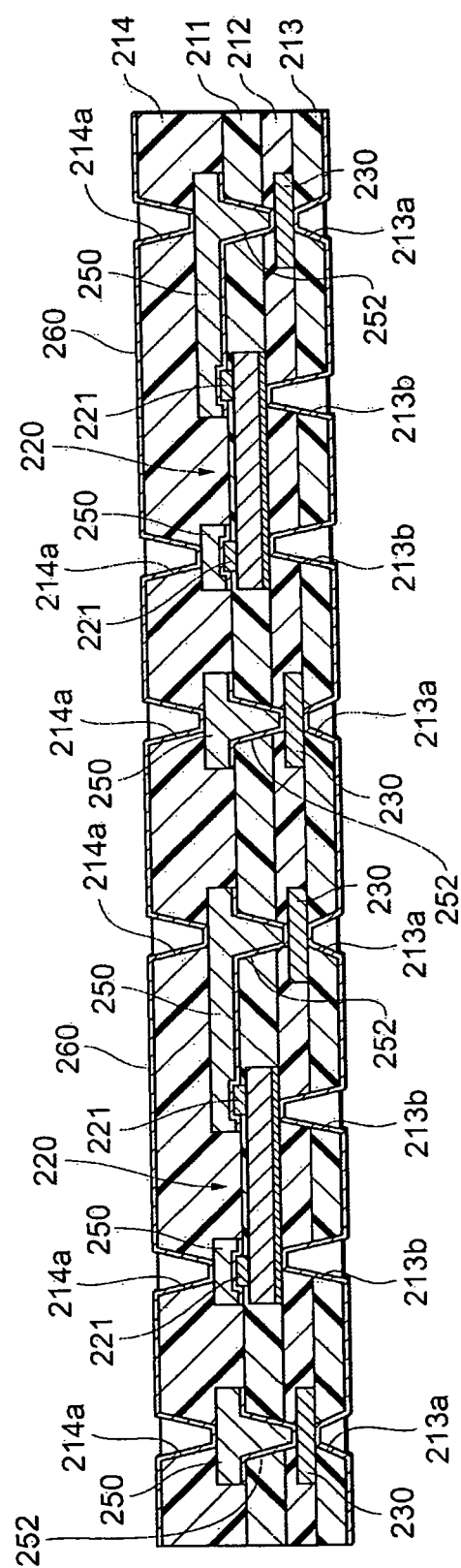
FIG. 17 is a step diagram showing one example of the procedure to manufacture the semiconductor-embedded substrate 200.

Then, a thin conductive underlayer 260 is formed on the whole surface including inner surfaces of the through holes 213a, 213b and 214a by a gas phase growth process such as the sputtering process (FIG. 17). Afterward, the wiring patterns 261, 262 of the outermost layer shown in FIG. 1 are formed in the same manner as in a procedure shown in FIGS. 11 to 13 (a wiring layer forming step). According to this step, the through holes 213a are filled with the through electrodes 263, whereby the wiring patterns 261 are connected to the alignment marks 230. Moreover, the through holes 213b are filled with the through electrodes 264, whereby the wiring patterns 261 are connected to the metal layer 222. Furthermore, the through holes 214a are filled with the through electrodes 265, whereby the wiring patterns 262 are connected to the wiring patterns 250.

According to the above procedure, the semiconductor-embedded substrate 200 shown in FIG. 1 is obtained.

According to the collective mounting method of the electronic components of the present invention, and the manufacturing method of the electronic component-embedded substrate by use of the collective mounting method, after the plurality of semiconductor devices 220 are successively tentatively set on the unhardened resin layer 212 in a non-pressurized state, the devices are simultaneously and collectively pressurized in the container 31 of the pressurizing and heating unit 3 via the internal gas G of the container, whereby the plurality of semiconductor devices 220 are uniformly pressed to the resin layer 212 in a short time before the unhardened resin layer 212 causes a state change. Moreover, since the unhardened resin layer 212 is heated and softened, and then hardens, the plurality of semiconductor devices 220 can uniformly be pressed and fixed to the resin layer 212 in a short time without being influenced by the state change of the resin layer 212. Therefore, when the plurality of semiconductor devices 220 are mounted on the resin layer 212 as the same insulating layer, generation of a mounting defect such as a bonding defect and a void can be prevented.

Moreover, the semiconductor-embedded substrate 200 on which the plurality of semiconductor devices 220 are arranged and the mounting defect is suppressed as described above can be manufactured in a remarkably short time, and hence productivity and reliability of a product can remarkably be improved. Furthermore, the pressurizing step and the heating step are simultaneously performed using the pressurizing and heating unit 3, so that the productivity can further be improved. In addition, since the semiconductor devices 220 are isotropically pressurized, warp and deformation of the devices and rising of the resin layer 212 can effectively be prevented.

Furthermore, in a case where the semiconductor devices 220 are mounted on the unhardened resin layer 212 by use of a gasping tool such as a collet for use in a die bonder unit, unlike a conventional method, instead of pressing the semiconductor devices 220 one by one as they are, the devices are simply disposed and tentatively set, and hence complicated mounting conditions of the semiconductor devices 220 (e.g., control of such a grasping position that the bumps 221 are not damaged during the pressing, a material of the grasping tool, a force to be applied to the grasping tool or the like) are not required. As a result, restrictive matters in a case where the semiconductor devices 220 are disposed on the unhardened resin layer 212 are relaxed, and a manufacturing process of the semiconductor-embedded substrate is easily controlled, so that the productivity can further be improved.

Figure 18:
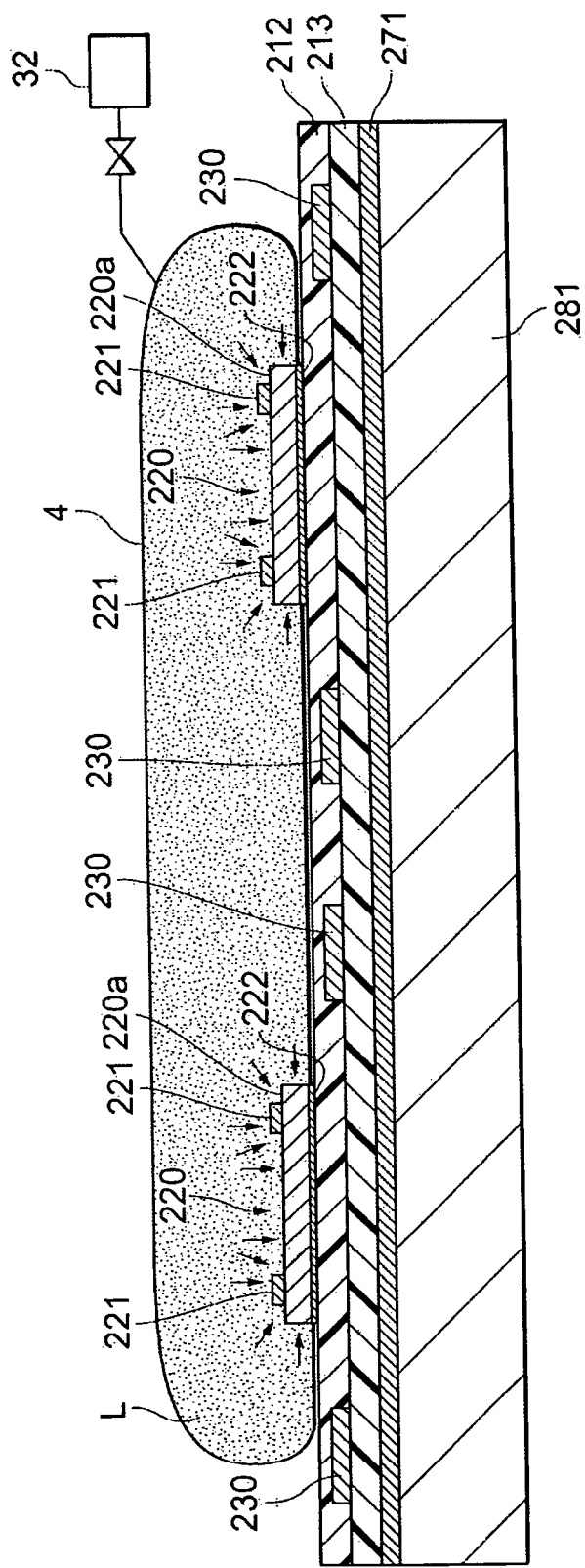
FIG. 18 is a step diagram showing a state in which another embodiment of a mounting method of electronic components according to the present invention is performed.
Figure 19:
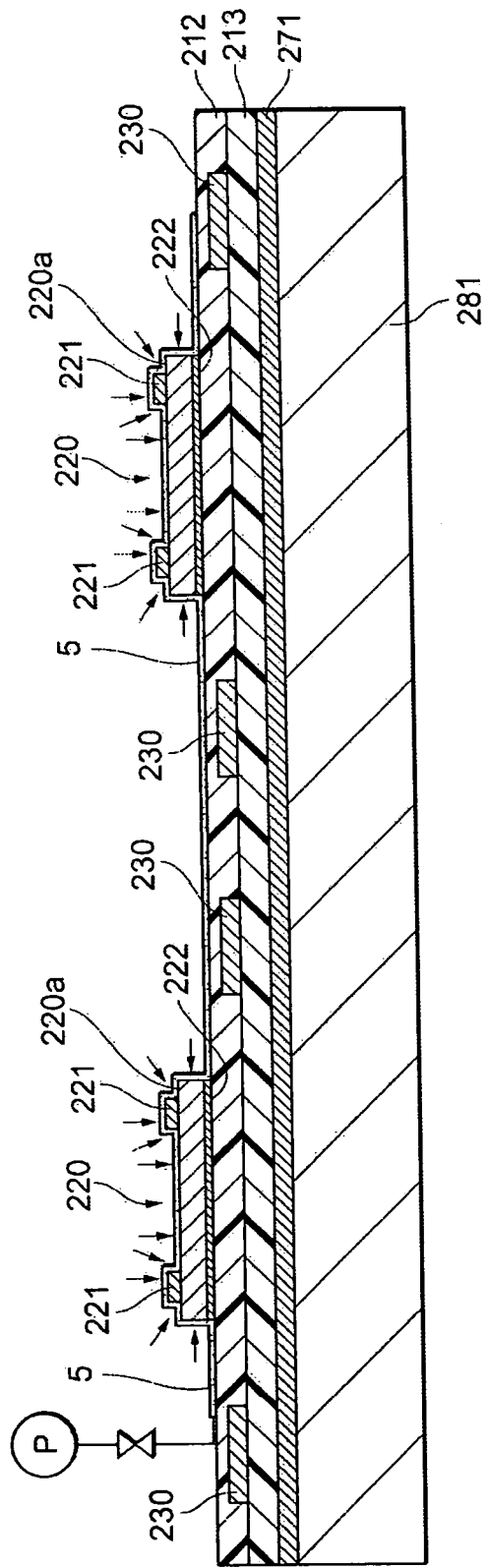
FIG. 19 is a step diagram showing a state in which the other embodiment of the mounting method of the electronic components according to the present invention is performed.
Figure 20:
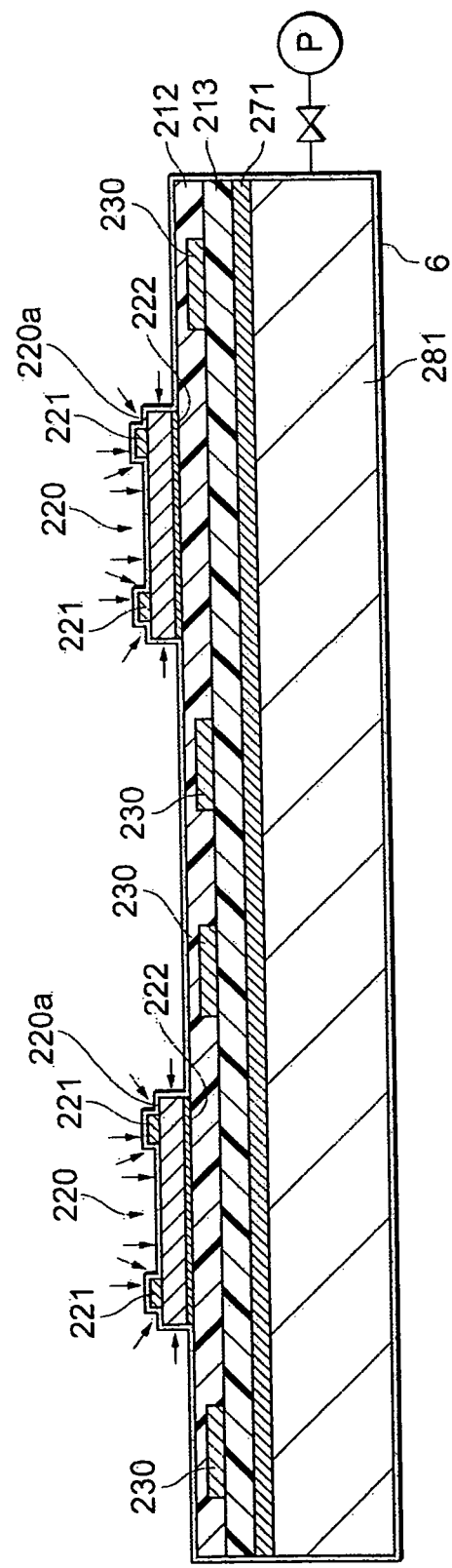
FIG. 20 is a step diagram showing a state in which the other embodiment of the mounting method of the electronic components according to the present invention is performed.

FIGS. 18 to 20 are step diagrams showing a state in which another embodiment of the collective mounting method of the electronic components according to the present invention is performed suitably in a case where the plurality of semiconductor devices 220 are mounted on the resin layer 212, and are diagrams schematically showing another example of the pressurizing step.

In an example shown in FIG. 18, first an unhardened resin layer 212 which has been obtained by the procedure shown in FIGS. 2 to 5 and on which a plurality of semiconductor devices 220 are disposed is covered with a bag-like film 4 (e.g., a thin film made of a resin or a rubber) having a stretching property or flexibility so as to cover the whole bare surface (i.e., the whole shown upper portion of the plurality of semiconductor devices 220) including main surfaces 220*a* of the plurality of semiconductor devices 220 and the surfaces of bumps 221. Subsequently, a fluid L such as a gas or a liquid is injected into the bag-like film 4 to pressurize the inside of the film 4. In consequence, since the film 4 has the stretching property or flexibility, as shown in the drawing, the film is pressed so as to come in close contact with the whole surface of the plurality of semiconductor devices 220 and the surface of the resin layer 212 present around the devices, and a pressure applied into the film 4 is simultaneously and isotropically applied to the plurality of semiconductor devices 220 and the resin layer 212 around the devices (a pressurizing step). That is, the film 4 functions as a partition wall (a diaphragm) which simultaneously and isotropically pressurizes the plurality of semiconductor devices 220 with the fluid L supplied into the film. In this case, the film 4 and the fluid L in the film function as pressurizing means as a pressure medium. It is to be noted that in the drawing, to facilitate visual recognition of the part of the film 4, an upper surface of the resin layer 212 is drawn away from a lower surface of the film 4, but in actual both the substrates come in close contact with each other.

Moreover, in an example shown in FIG. 19, first an unhardened resin layer 212 which has been obtained by the procedure shown in FIGS. 2 to 5 and on which a plurality of semiconductor devices 220 are disposed is covered with a film 5 (e.g., a thin film made of a resin or a rubber) having a stretching property or flexibility so as to cover the whole bare surface (i.e., the whole shown upper portion of the plurality of semiconductor devices 220) including main surfaces 220*a* of the plurality of semiconductor devices 220 and the surfaces of bumps 221. Subsequently, air of a space between the film 5 and the plurality of semiconductor devices 220 is discharged by exhaust means P such as a vacuum pump, and the plurality of semiconductor devices 220 and the film 5 are attached to each other in a substantial vacuum state (collectively vacuum-laminated). In consequence, since the film 5 has the stretching property or flexibility, as shown in the drawing, the film is pressed so as to come in close contact with the whole surface of the plurality of semiconductor devices 220 and the surface of the resin layer 212 present around the devices, and the plurality of semiconductor devices 220 and the resin layer 212 around the devices are simultaneously and isotropically pressurized from the outside of the film 5 with an atmospheric pressure (a pressurizing step). In this case, the film 5 functions as a partition wall (a diaphragm) which separates a substantially evacuated space between the film 5 and the plurality of semiconductor devices 220 from a surrounding atmosphere having the atmospheric pressure and which simultaneously and isotropically pressurizes the plurality of semiconductor devices 220. In this example, the film 5 and the atmosphere function as pressurizing means as a pressure medium.

Furthermore, in an example shown in FIG. 20, first the whole unhardened resin layer 212 which has been obtained by the procedure shown in FIGS. 2 to 5 and on which a plurality of semiconductor devices 220 are disposed is stored in a bag-like film 6 (e.g., a thin film made of a resin or a rubber) having a stretching property or flexibility. Subsequently, air in the bag-like film 6 is discharged by exhaust means P such as a vacuum pump, and the plurality of semiconductor devices 220 and the film 6 are attached to each other in a substantial vacuum state (collectively vacuum-laminated). In consequence, since the film 6 has the stretching property or flexibility, as shown in the drawing, the film is pressed so as to come in close contact with the whole surface of the plurality of semiconductor devices 220 and the surface of the resin layer 212 present around the devices, and the plurality of semiconductor devices 220 and the resin layer 212 are simultaneously and isotropically pressurized from the outside of the film 6 with an atmospheric pressure (a pressurizing step). In this case, the film 6 functions as a partition wall (a diaphragm) which separates a substantially evacuated space in the bag-like film 6 from a surrounding atmosphere having the atmospheric pressure and which simultaneously and isotropically pressurizes the plurality of semiconductor devices 220 and the whole resin layer 212. Also in this example, the film 6 and the atmosphere function as pressurizing means as a pressure medium.

Afterward, a constitution subjected to the pressurizing step by use of the films 4 to 6 as described above are stored in a drying machine or the like, or disposed on a support base (a table) having a heating function, for example, a heater plate or a heater stage, the whole constitution is heated to soften the resin layer 212 and further harden the layer, whereby collective fixing and mounting of the plurality of semiconductor devices 220 on the resin layer 212 are completed. The constitution obtained in this manner is subjected to the same procedure as that described above with reference to FIGS. 7 to 17, thereby obtaining a semiconductor-embedded substrate 200 shown in FIG. 1.

According to such a collective mounting method of the electronic components and the manufacturing method of the electronic component-embedded substrate by use of the mounting method of the present invention, in a case where the plurality of semiconductor devices 220 are mounted on the resin layer 212, all the semiconductor devices 220 are once tentatively set on the unhardened resin layer 212, and then simultaneously, collectively and isotropically pressurized, so that the plurality of semiconductor devices 220 are uniformly pressed to the resin layer 212 before a state change of the resin layer 212 is caused.

Then, since the resin layer 212 is heated to harden in this state, the plurality of semiconductor devices 220 can uniformly be pressed and fixed to the hardened resin layer 212 as an insulating layer in a short time. Therefore, it is possible to prevent a mounting defect at a time when the plurality of semiconductor devices 220 are mounted on the same insulating layer, and productivity and reliability of the product can remarkably be improved.

Figure 22:
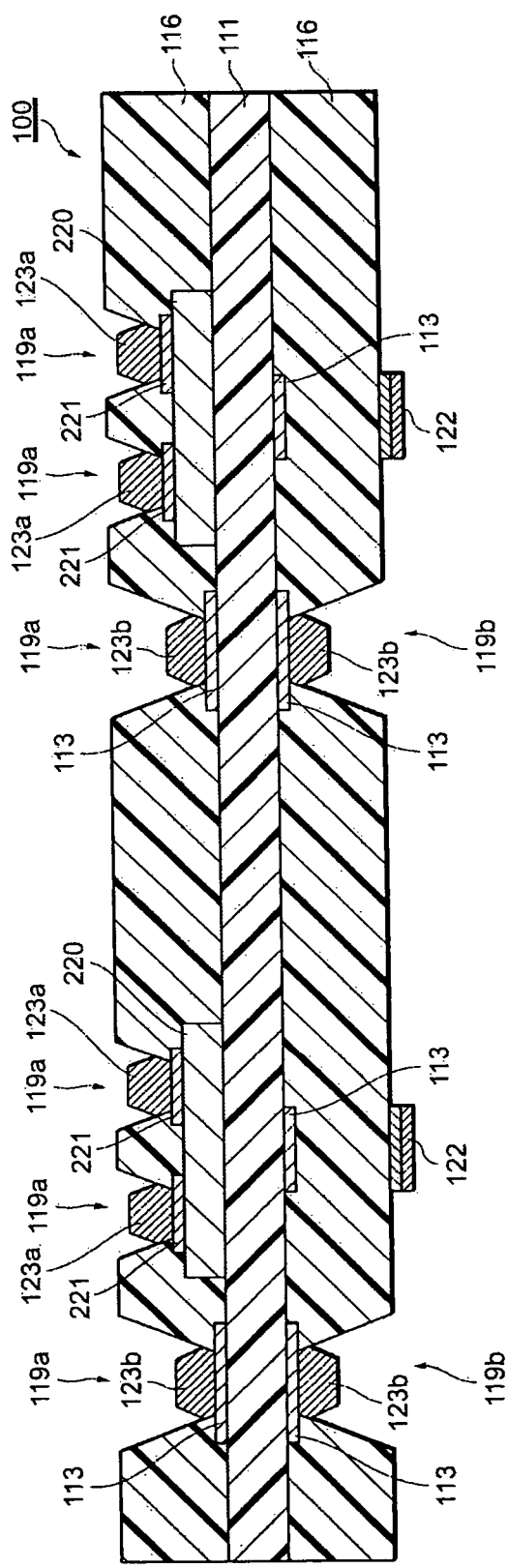
FIG. 22 is a sectional view showing a main part of one example of an electronic component-embedded substrate manufactured by a manufacturing method of the electronic component-embedded substrate according to the present invention.

FIG. 22 is a sectional view showing a main part of one example of an electronic component-embedded substrate manufactured by the manufacturing method of the electronic component-embedded substrate according to the present invention.

In a semiconductor-embedded substrate 100 (an electronic component-embedded substrate), conductive patterns 113 are formed at both surfaces of a core substrate 111, and in a resin layer 116 laminated on the core substrate 111, a plurality of semiconductor devices 220 are arranged. The resin layers 116 are provided with via-holes 119*a*, 119*b* so that a lower part/an upper part (a core substrate 111 side) of the layers, the conductive patterns 113 arranged in the layers and bumps 221 of the plurality of semiconductor devices 220 are protruded from the resin layers 116. In the via-holes 119*a*, 119*b*, the bumps 221 and the conductive patterns 113 are connected to via-hole electrode portions 123*a*, 123*b* of conductive patterns 122, respectively.

Moreover, the via-hole electrode portions 123*a*, 123*b* are formed so as to include trapezoidal sectional portions shown in the drawing. In other words, substantially upper half portions are formed so as to broaden toward ends so that sectional areas increase toward the conductive patterns 113 and the bumps 221. The electrode portions on opposite sides come in contact with vicinities of bottom portions of inner walls of the via-holes 119a, 119b, and do not come in contact with portions above the bottom portions, and space areas (voids) are defined between the inner walls of the via-holes 119a, 119b and the via-hole electrode portions 123a, 123b. Furthermore, side wall slope ends of the via-hole electrode portions 123a, 123b are formed so as to abut on side walls of the via-holes 119a, 119b.

The core substrate 111 performs a role as a base to secure a mechanical strength of the whole semiconductor-embedded substrate 100, and there is not any special restriction on the core substrate, but, for example, a resin substrate or the like may be used. As a material of the resin substrate, it is preferable to use resin cloth such as glass cloth, Kevlar, aramid or liquid crystal polymer, or a material in which a core material constituted of a porous sheet of a fluorine resin or the like is impregnated with a thermosetting resin, a thermoplastic resin or the like, and it is preferable that a thickness of the material is about 20 μm to 200 μm. As an application of a substrate to be subjected to laser processing, for a purpose of homogenization of processing conditions, a coreless sheet material such as LCP, PPS, PES, PEEK or PI may be used.

The via-holes 119a, 119b are connection holes provided at the resin layer 116 in order to physically connect the conductive patterns 113 as bodies to be wired and the plurality of semiconductor devices 220 to the conductive patterns 122, and have such positions and depths that at least a part of the conductive patterns 113 and the bumps 221 of the plurality of semiconductor devices 220 is exposed from the resin layer 116. That is, the conductive patterns 113 and the bumps 221 are provided so that at least a part of them is exposed at the bottom portions of the via-holes 119a, 119b.

There is not any special restriction on a method for forming the via-holes 119a, 119b, and a known method such as laser processing, etching processing or blast processing may be used. When the laser processing is performed, smear is generated, and hence it is preferable to perform de-smear treatment after the connection holes are formed.

Configurations of the via-holes 119a, 119b may have such a dimensional shape that the conductive patterns 113 and the bumps 221 can physically be connected to the via-hole electrode portions 123a, 123b in these holes, and can appropriately be determined in consideration of depths of the holes, targeted mounting density, targeted connection stability or the like, and examples of the configuration include a cylindrical configuration in which an opening end has a diameter of about 5 to 200 μm and a square tubular configuration having a maximum diameter of about 5 to 200 μm. The configuration may be a straight tube or not. In the drawing, as an example, inversely pyramid configurations are shown. Such via-holes 119a, 119b having a width diameter which gradually increases from a bottom portion toward an opening end portion may be pierced by, for example, etching processing, blast processing or the like.

Moreover, the conductive patterns 122 are wiring layers which electrically connect the conductive patterns 113 as bodies to be wired to the bumps 221. There is not any special restriction on a material of this conductive pattern 122, a conductor such as a metal generally for use in wiring may be used, and the material may be the same as or different from that of the conductive pattern 113 or the bump 221. In a case where forming of the conductive patterns 122 includes an etching step, an etchant (an etching solution for wet etching, etchant particles for dry etching or the like) which does not etch the material of the conductive pattern 113 or the bump 221 may appropriately be selected for use.

Furthermore, there is not any special restriction on a thickness of the conductive pattern 122, but if the pattern is excessively thin, connection stability drops, and hence the thickness is usually about 5 to 70 μm. When the thickness of the conductive pattern 122 is set to be smaller than the depth of the via-holes 119a, 119b, in via-hole connecting portions, the conductive patterns 122 (the via-hole electrode portions 123a, 123b) are stored in the via-holes 119a, 119b, and a wiring height is reduced, thereby contributing to thinning. Moreover, an amount to be wired can be reduced to lower a wiring resistance and a parasitic capacity, and the connection stability can preferably be improved.

Next, one example of the manufacturing method of the semiconductor-embedded substrate 200 will be described with reference to the drawings. FIGS. 23 to 32 are step diagrams showing one example of a procedure of manufacturing the semiconductor-embedded substrate 100.

Figure 23:
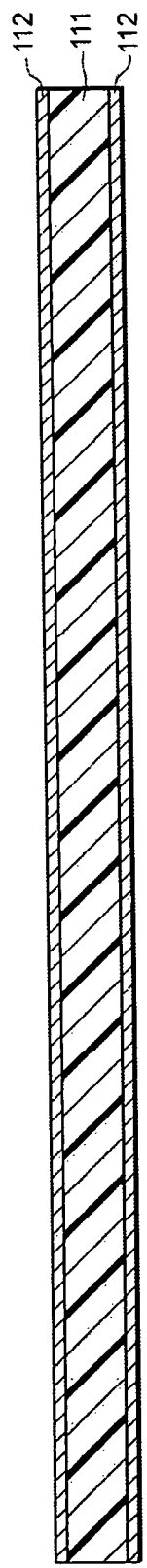
FIG. 23 is a step diagram showing one example of a procedure to manufacture a semiconductor-embedded substrate 100.

First, a resin substrate having both surfaces provided with copper foils, in which copper foils 112 are attached to both surfaces of a core substrate 111, is prepared (FIG. 23). Here, the copper foils 112 are to form conductive patterns 113, and when an electrolytic copper foil (copper dissolved and ionized in an aqueous copper sulfate solution is continuously electrically deposited with an electrodeposition roller to form the copper foil) manufactured for a printed wiring board or a rolled copper foil is used, fluctuations of the thickness can remarkably be reduced. If necessary, the thickness of the copper foil 112 may be regulated by a technique such as SWEP.

Figure 24:
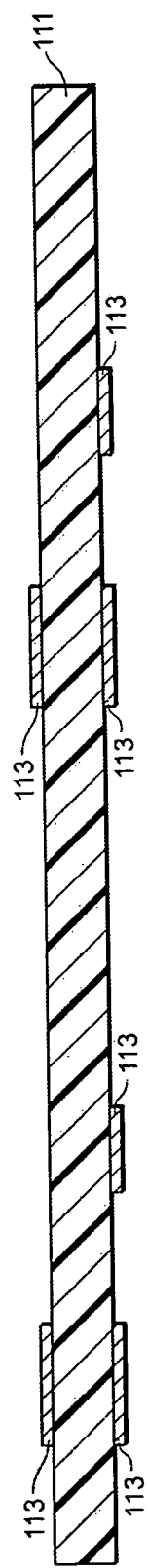
FIG. 24 is a step diagram showing one example of the procedure to manufacture the semiconductor-embedded substrate 100.

Subsequently, the copper foils 112 provided on both the surfaces of the core substrate 111 are selectively removed by photolithography and etching to form conductive patterns 113 on the core substrate 111 (FIG. 24). At this time, the copper foils 112 present on predetermined areas of the core substrate 111 are entirely removed to secure a mounting area for a plurality of semiconductor devices 220.

Figure 25:
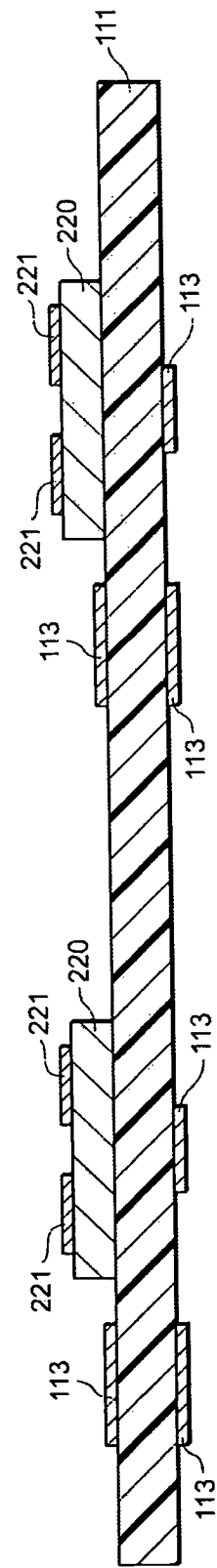
FIG. 25 is a step diagram showing one example of the procedure to manufacture the semiconductor-embedded substrate 100.

Subsequently, the predetermined areas of the core substrate 111 are coated with an unhardened adhesive (not shown: an unhardened resin) formed of a resin composition, and the plurality of semiconductor devices 220 are disposed in a so-called face-up state (FIG. 25). Then, the core substrate 111 on which the plurality of semiconductor devices 220 have been disposed is subjected to a pressurizing step and a heating step in the same manner as in FIGS. 6, 18 to 20 described above, and the adhesive is hardened to fix and mount the plurality of semiconductor devices 220 on the core substrate 111 (coated with the adhesive).

Figure 26:
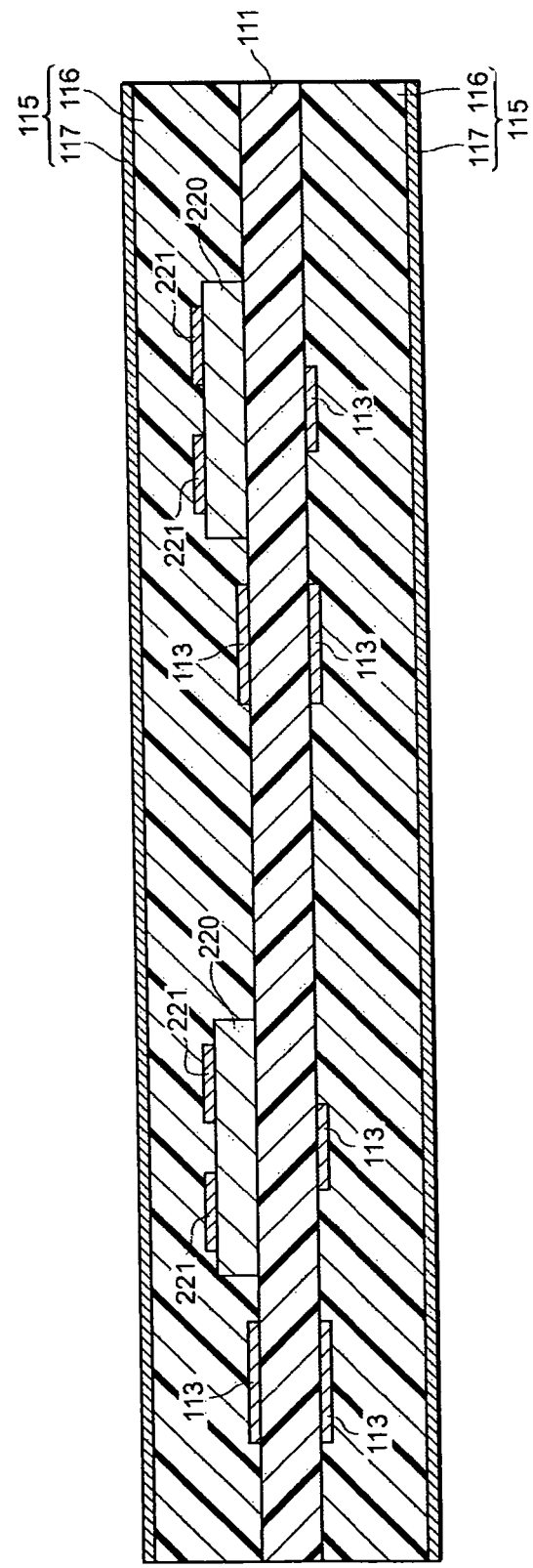
FIG. 26 is a step diagram showing one example of the procedure to manufacture the semiconductor-embedded substrate 100.

Subsequently, resin sheets 115 each having one surface provided with a copper foil are attached to both surfaces of the core substrate 111 on which the plurality of semiconductor devices 220 have been disposed. (FIG. 26). In the resin sheet 115 having one surface provided with the copper foil according to the present manufacturing example, a resin sheet 117 is attached to one surface of a thermosetting resin sheet 116 made of an epoxy resin of stage B. Such resin sheets 115 each having one surface provided with the copper foil are prepared, resin surfaces of the sheets are attached to both surfaces of the core substrate 111, and then the sheets are hot-pressed to integrate, with the core substrate 111, the resin sheets 115 each having one surface provided with the copper foil. In consequence, the plurality of semiconductor devices 220 are embedded in the printed wiring board, and the thermosetting resin sheets 116 form resin layers 116.

Figure 27:
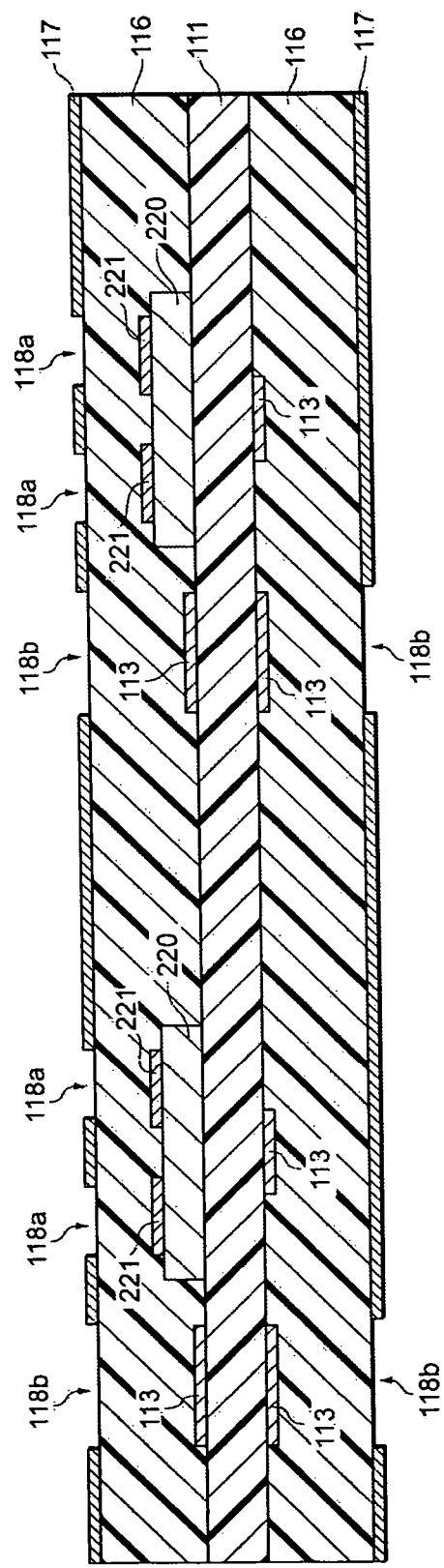
FIG. 27 is a step diagram showing one example of the procedure to manufacture the semiconductor-embedded substrate 100.

Subsequently, the resin sheets 117 provided on the surfaces of the resin layers 116 are selectively removed by conformal processing to form a mask pattern for forming via-holes 119a, 119b (FIG. 27). It is preferable to perform the conformal processing by photolithography and etching, because highly precise and fine processing can be realized. It is to be noted that there is not any special restriction on an opening width diameter of the mask pattern, but it is preferable to set the diameter to about 10 to 200 µm, and it is preferable to increase the opening width diameter based on the depth of the via-holes 119a, 119b. In consequence, opening patterns 118a are formed right above bumps 221 of the plurality of semiconductor devices 220, and opening patterns 118b are formed right under conductive patterns 113 formed on the surface of the core substrate 111.

Figure 28:
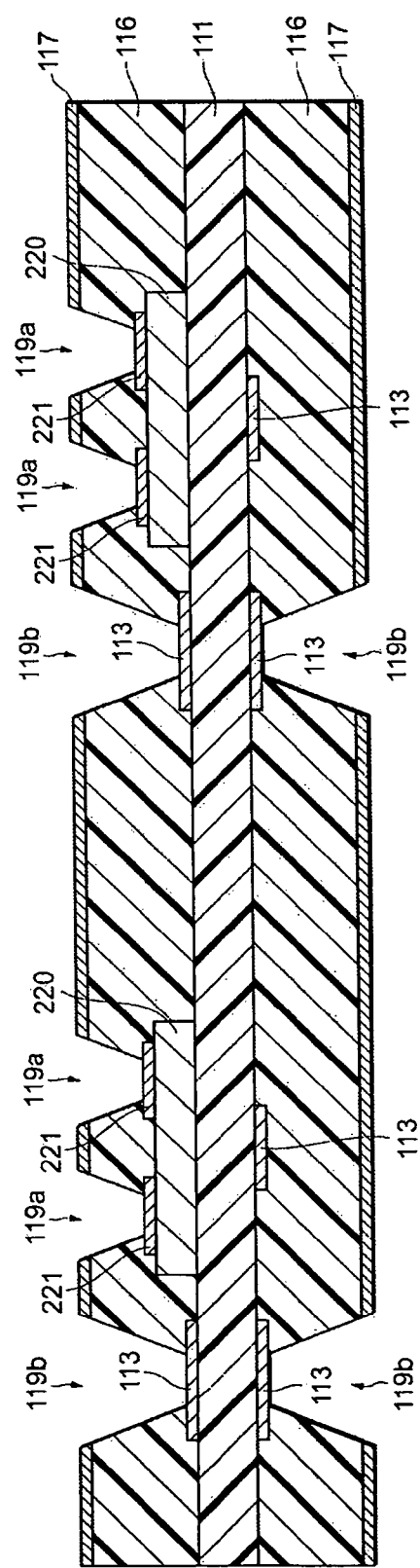
FIG. 28 is a step diagram showing one example of the procedure to manufacture the semiconductor-embedded substrate 100.

Then, the via-holes 119a, 119b are formed by a sand blast treatment using the resin sheet 117 subjected to the conformal processing as a mask (FIG. 28). In the sand blast treatment, blast particles such as non-metal particles or metal particles are projected to grind a body to be processed, but metal layers such as the bumps 221 and the conductive patterns 113 can be provided right under the opening patterns 118a, 118b to selectively form the via-holes having different depths. In this case, when the via-holes 119a are formed, the bumps 221 function as stoppers, so that the plurality of semiconductor devices 220 can be prevented from being damaged by the blast particles. Moreover, when the via-holes 119b are formed, the conductive patterns 113 of inner layers function as stoppers, so that the via-holes 119b are inhibited from being dug deeper. Thus, a structure is formed in which the via-holes 119a, 119b are constituted as non-through holes, and the bumps 221 or the conductive patterns 113 are exposed at the bottom portions of the via-holes 119a, 119b, respectively.

Figure 29:
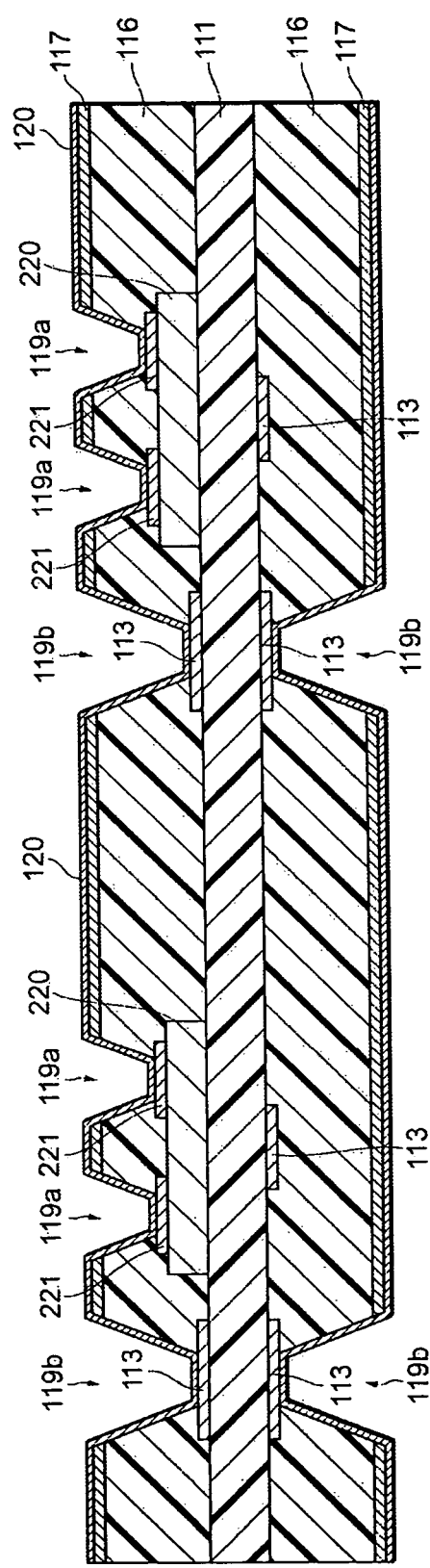
FIG. 29 is a step diagram showing one example of the procedure to manufacture the semiconductor-embedded substrate 100.
Figure 30:
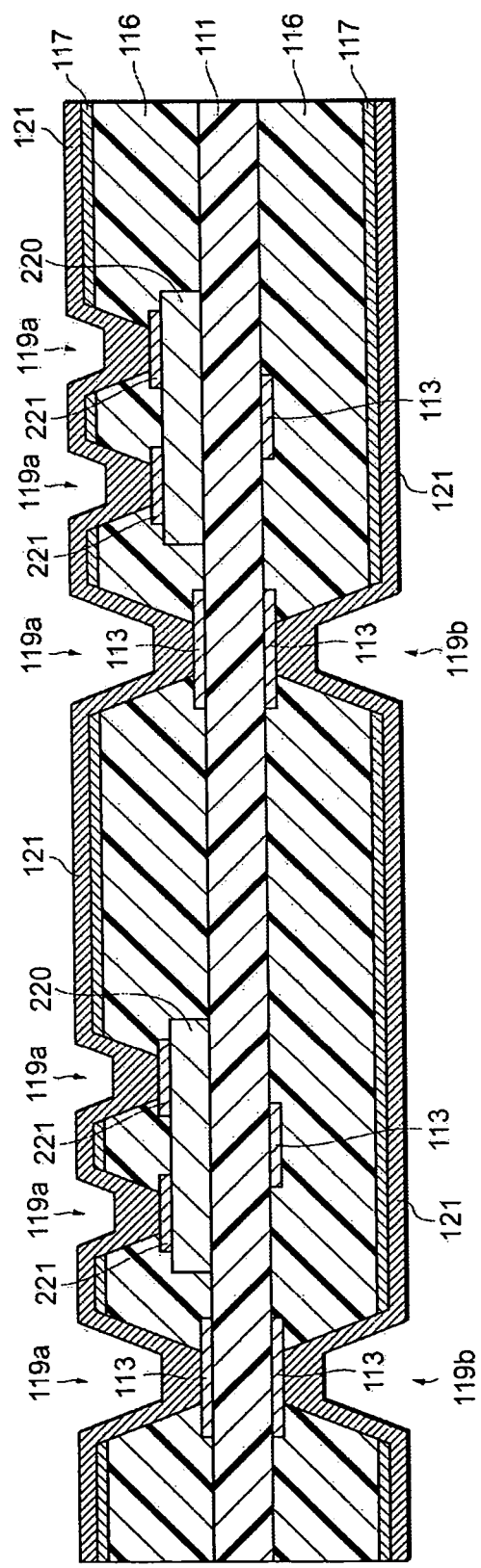
FIG. 30 is a step diagram showing one example of the procedure to manufacture the semiconductor-embedded substrate 100.

Subsequently, a conductive underlayer 120 is formed over the whole exposed surface of the via-holes 119a, 119b including inner wall surfaces of the via-holes 119a, 119b (FIG. 29). It is preferable to use an electroless plating (chemical plating) process as a method for forming the conductive underlayer 120, but a sputtering process, an evaporation process or the like may be used. The conductive underlayer 120 performs a role of an underlayer metal (or a seed layer) for electrolytic (electric) plating to be subsequently performed, and may have a small thickness, and the thickness can appropriately be selected from a range of, for example, several ten nm to several µm. Subsequently, a conductor metal is developed from the conductive underlayer 120 by an electrolytic plating process (FIG. 30). In consequence, conductive layers 121 including the conductive underlayers 120 are formed on the inner wall surfaces of the via-holes 119a, 119b.

Figure 31:
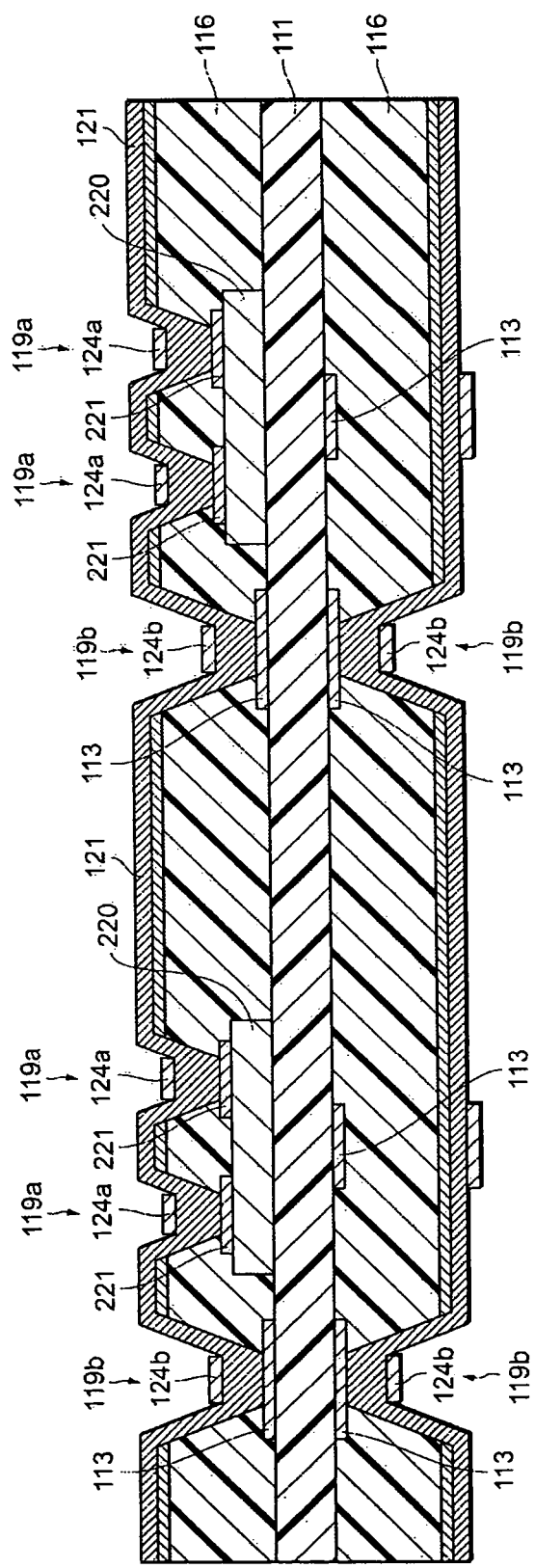
FIG. 31 is a step diagram showing one example of the procedure to manufacture the semiconductor-embedded substrate 100.

Afterward, resist layers 124a, 124b are formed on areas forming conductive patterns 122 of the conductive layers 121 by photolithography (FIG. 31). Here, in order to form via-hole electrode portions 123a, 123b of the conductive patterns 122 so that the portions do not come in contact with inner walls of the via-holes 119a, 119b, the resist layers 124a, 124b are formed so that widths of the resist layers 124a, 124b in the via-holes 119a, 119b are smaller than upper opening width diameters ra, rb of the via-holes.

Figure 32:
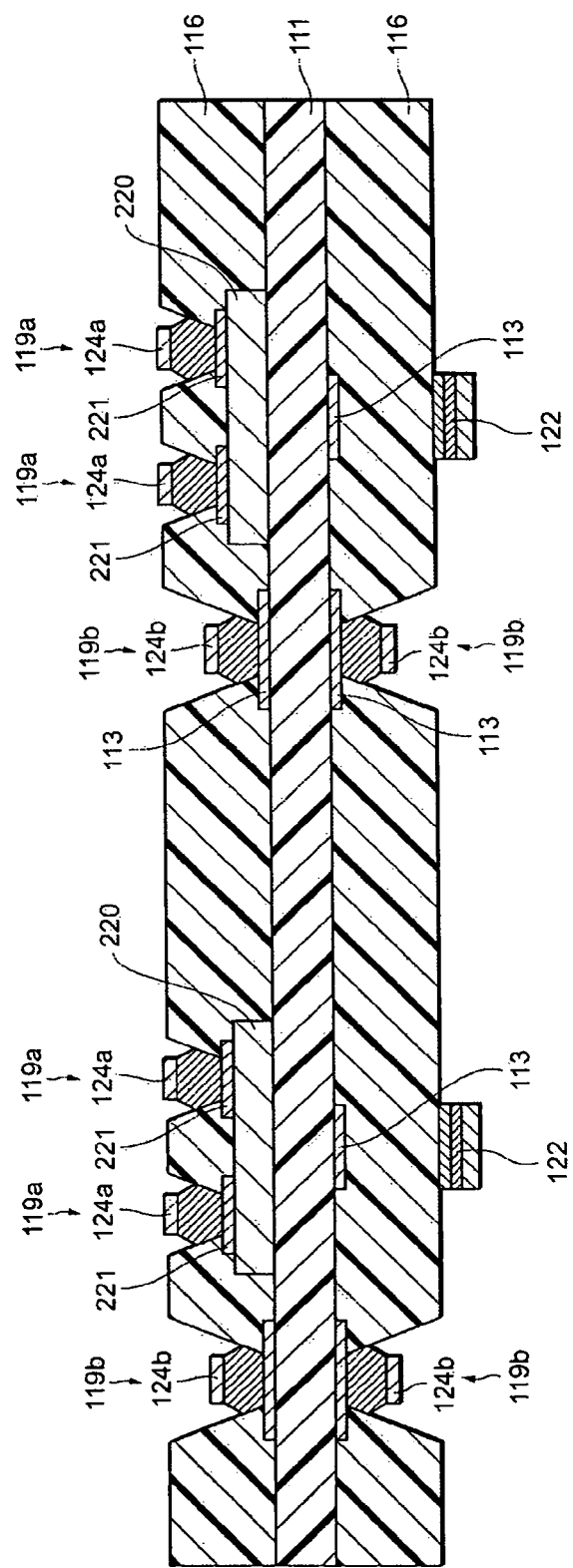
FIG. 32 is a step diagram showing one example of the procedure to manufacture the semiconductor-embedded substrate 100.

Subsequently, etching is performed using the resist layers 124a, 124b as an etching mask to selectively remove the conductive layer 121 other than a wiring pattern portion, and the conductive patterns 122 (the via-hole electrode portions 123a, 123b) are formed (FIG. 32). At this time, since an etching rate of the conductive layer 121 around the mask is smaller than that of another portion, the via-hole electrode portions 123a, 123b as wiring layers to be formed have such a shape as to broaden toward an end.

Then, the resist layers 124a, 124b on the conductive patterns 122 are removed using a peeling solution to obtain the semiconductor-embedded substrate 100 having the constitution shown in FIG. 1.

Even in the semiconductor-embedded substrate 100 obtained in this manner, a function and an effect similar to those of the above-mentioned semiconductor-embedded substrate 200 can be obtained.

It is to be noted that as described above, the present invention is not limited to the above embodiment, and van variously be modified without departing from the scope. For example, in the semiconductor-embedded substrate 200, a passive component such as a resistance or a capacitor can be mounted on at least one of the wiring patterns 261, 262 of the outermost layer. Instead of simultaneously performing the pressurizing step and the heating step, the pressurizing and heating unit 3 may perform the heating step after performing the pressurizing step. Conversely, to perform the pressurizing step as shown in FIGS. 18 to 20, a substrate on which the plurality of semiconductor devices 220 have been disposed may be stored and installed at a drying machine, a heating base or the like to simultaneously perform the heating step. Furthermore, to form the wiring pattern, a catalyst layer may be provided instead of the conductive underlayers 251, 260, and electroless plating may be performed, instead of the electrolytic plating, to form the wring pattern. In a case where the conductive underlayer 251 is replaced with the catalyst layer to perform the electroless plating, the support substrate 281 does not have to be covered with the dry film 202. Furthermore, the present invention is not limited to a case where two semiconductor devices 220 are disposed as shown in the drawing, and there is not any special restriction as long as a plurality of semiconductor devices are disposed. In addition, the present invention is not limited to a case where the plurality of semiconductor devices 220 are arranged in one direction (a one-dimensional direction), and the present invention is effective even in a case where the devices are arranged in a planar direction (a two-dimensional direction).

EXAMPLES

Specific examples of the present invention will be described, but the present invention is not limited to these examples.

Example 1

A flat plate-like base was coated with an unhardened resin with a thickness of 60 µm and in the form of a sheet, a plurality of semiconductor ICs (semiconductor devices as electronic components) having a vertical size of 5 mm×a lateral size of 5 mm×a thickness of 50 µm in a bare chip state were successively disposed on the base by use of a die bonder so that a back surface (a surface on which any bump was not formed) of each IC abutted on a resin, and the plurality of semiconductor devices tentatively set on an unhardened resin layer were produced in the same manner as in the state shown in FIG. 5. Subsequently, this was stored in a pressurizing and heating tank, and pressurized and heated on predetermined conditions by use of air as a pressure medium, whereby the semiconductor ICs were isotropically pressurized and pressed to the unhardened resin layer while hardening the resin layer, and a mounted article was obtained in which the semiconductor ICs were fixed onto the resin layer (an insulating layer). It is to be noted that the heating and the pressurizing were performed in a range of the above-mentioned heating and pressurizing conditions.

Comparative Example 1

A base coated with an unhardened resin having a thickness of 60 μm in the form of a sheet was left to stand still on a heater stage heated to 100° C. Every time the same semiconductor IC as that used in Example 1 was disposed on the base by use of a die bonder so that a back surface (a surface on which any bump was not formed) of the IC abutted on a resin, the IC was pressed to a resin layer as it was by use of the die bonder, and this operation was repeated. During the pressing, in the atmosphere, a force of 2N was applied to a tool head of the die bonder to press the IC for ten seconds. Semiconductor devices were mounted three hours, five hours and twelve hours after the start of mounting.

Evaluation 1

Figure 33:
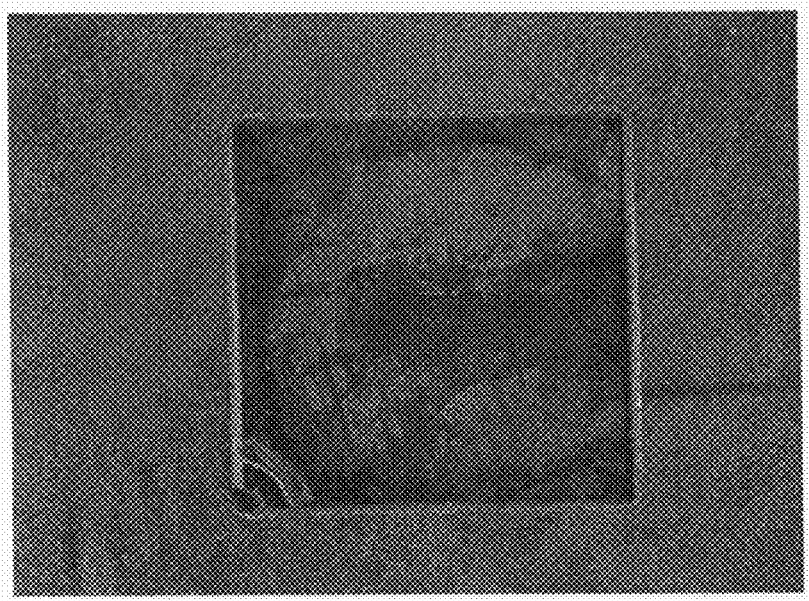
FIG. 33 is a planar microscope photograph of a resin layer after peeling a semiconductor IC in a mounted article of Example 1.
Figure 34:
FIG. 34 is a planar microscope photograph of a resin layer after peeling a semiconductor IC mounted at the start of mounting in a mounted article of Comparative Example 1.
Figure 35:
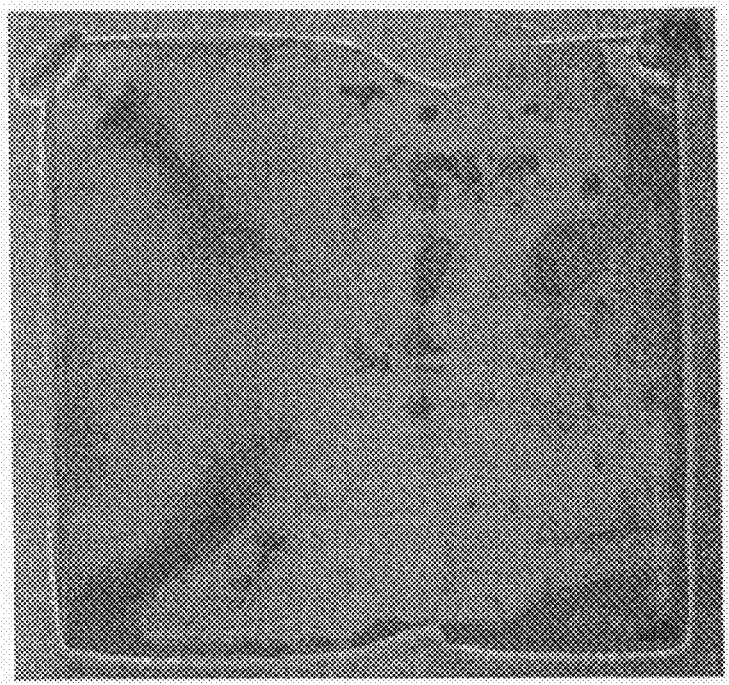
FIG. 35 is a planar microscope photograph of the resin layer after peeling a semiconductor IC mounted three hours later in the mounted article of Comparative Example 1.
Figure 36:
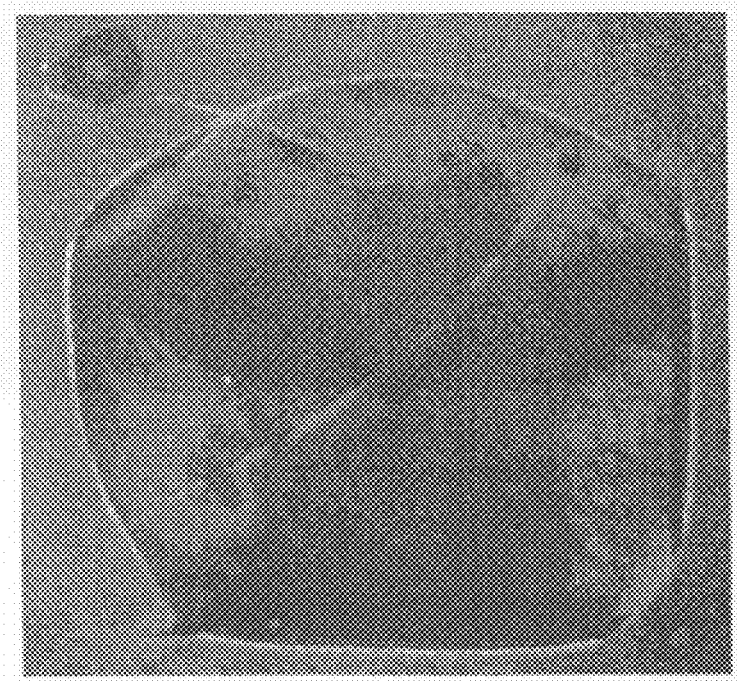
FIG. 36 is a planar microscope photograph of the resin layer after peeling a semiconductor IC mounted five hours later in the mounted article of Comparative Example 1.
Figure 37:
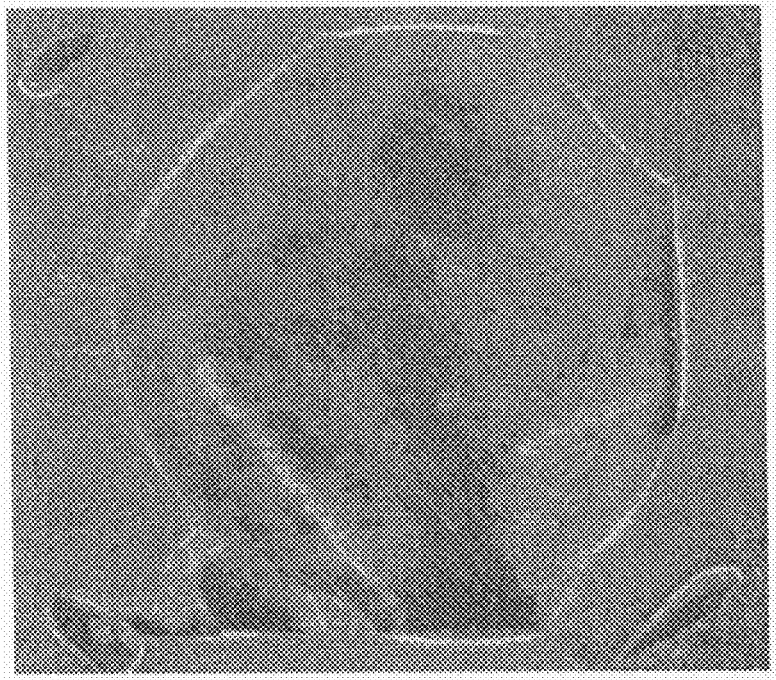
FIG. 37 is a planar microscope photograph of the resin layer after peeling a semiconductor IC mounted twelve hours later in the mounted article of Comparative Example 1.

One semiconductor IC of the mounted article obtained in Example 1 was peeled from the resin layer. In the mounted article obtained in Comparative Example 1, each of the semiconductor ICs mounted three hours, five hours and twelve hours after the start of mounting was peeled from the resin layer. Surface states of the respective resin layers were observed. FIG. 33 is a planar microscope photograph of the resin layer after peeling the semiconductor IC in the mounted article of Example 1, and FIGS. 34 to 37 are planar microscope photographs of the resin layers after peeling the semiconductor ICs mounted at the start of mounting, three hours later, five hours later and twelve hours later in the mounted article of Comparative Example 1. It was confirmed from the photograph shown in FIG. 33 that in the mounted article of Example 1, the whole semiconductor IC was bonded to the resin layer and that any foam (void) was not present at the surface of the resin layer (a bonding interface between the semiconductor IC and the resin layer). On the other hand, it was found from the photographs shown in FIGS. 34 to 37 that in the mounted article of Comparative Example 1, with an elapse of several hours from the start of the mounting of the semiconductor IC, a peripheral edge portion of the semiconductor IC was not easily bonded to the resin layer, and with an elapse of time after the start of the mounting, a portion that was not bonded to the resin layer tended to enlarge inwardly from the peripheral edge portion of the semiconductor IC.

Comparative Example 2

A base coated with an unhardened resin layer was left to stand in the atmosphere to forcibly absorb humidity in the resin layer, then semiconductor ICs were pressed on the same pressurizing and heating conditions as those of Comparative Example 1, and a mounted article was obtained. This was performed in order to evaluate a state change due to the humidity absorbed in the resin layer.

Evaluation 2

Figure 38:
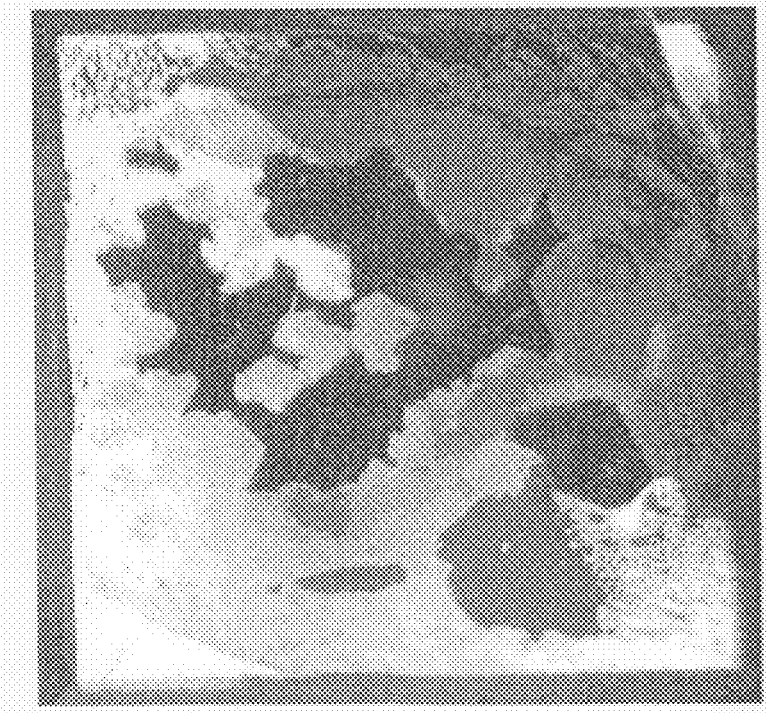
FIG. 38 is a planar microscope photograph of a resin layer after peeling a semiconductor IC in a mounted article of Comparative Example 2.

In the same manner as in Evaluation 1, the semiconductor IC was forcibly peeled from the mounted article obtained in Comparative Example 2 to observe a surface state of the resin layer. FIG. 38 is a planar microscope photograph of the resin layer after peeling the semiconductor IC in the mounted article of Comparative Example 2. Black portions of the photograph shown in FIG. 38 indicate that the surface of the base (a base material) under the resin layer is exposed. It has been found from this observation that remarkable foaming was generated at the surface of the resin layer (a bonding interface between the semiconductor IC and the resin layer) in the mounted article of Comparative Example 2.

It has been confirmed from the above description that any mounting defect of the semiconductor IC was not caused in the mounted article of the example, whereas mounting defects such as a bonding defect of the semiconductor IC and a void were generated in the mounted articles of the comparative examples.

As described above, according to a collective mounting method of electronic components of the present invention, and a manufacturing method of an electronic component-embedded substrate by use of the mounting method, in a case where a plurality of electronic components are mounted on an insulating layer including a single resin layer, the plurality of electronic components can uniformly be pressed and fixed to the insulating layer in a short time without being influenced by a change of a resin state. In consequence, since productivity and reliability of an electronic component-embedded substrate product can remarkably be improved, the present invention can broadly and effectively be used in an apparatus in which the electronic components are embedded, a unit, a system, various devices and the like especially in a case where miniaturization and high performance are demanded.

What is claimed is:

1. A manufacturing method of a substrate embedded with a plurality of electronic active components, comprising:
   fixing collectively the plurality of electronic active components by disposing the plurality of electronic active components on an uncured resin;
   pressurizing collectively the plurality of electronic active components by injecting a fluid into a film such that the fluid in the film and the film function as a pressurizing means and a pressurizing medium;
   heating and hardening the resin to form a first insulating layer;
   forming a second insulating layer on the plurality of fixed electronic active components; and
   forming a wiring layer to be electrically connected to the plurality of electronic active components.

2. A manufacturing method of a substrate embedded with a plurality of electronic active components and of electronic passive components, comprising:
   fixing collectively the plurality of electronic active components and of electronic passive components by disposing the plurality of electronic active components and of electronic passive components on an uncured resin;
   pressurizing collectively the plurality of electronic active components and of electronic passive components by injecting a fluid into a film such that the fluid in the film and the film function as a pressurizing means and a pressurizing medium;
   heating and hardening the resin to form a first insulating layer;
   forming a second insulating layer on the plurality of fixed electronic active components and of electronic passive components; and
   forming a wiring layer to be electrically connected to the plurality of electronic active components and of electronic passive components.

3. The manufacturing method of claim 1, wherein the fluid is gas.

4. The manufacturing method of claim 1, wherein the pressurizing and heating steps are performed in a chamber that confines the fluid therein.

5. The manufacturing method of claim 1, wherein the uncured resin is formed before the pressurizing and heating steps, and the second insulating layer is formed after the pressurizing and heating steps.

6. The manufacturing method of claim 1, wherein the pressurizing and heating steps are performed while a bottom surface of at least one of the plurality of electronic active components abuts and is completely covered by the uncured resin.

7. The manufacturing method of claim 2, wherein the fluid is gas.

8. The manufacturing method of claim 2, wherein the pressurizing and heating steps are performed in a chamber that confines the fluid therein.

9. The manufacturing method of claim 2, wherein the uncured resin is formed before the pressurizing and heating steps, and the second insulating layer is formed after the pressurizing and heating steps.

10. The manufacturing method of claim 2, wherein the pressurizing and heating steps are performed while a bottom surface of at least one of the plurality of electronic active components abuts and is completely covered by the uncured resin.

* * * * *